US011749788B2

(12) United States Patent
Park et al.

(10) Patent No.: US 11,749,788 B2
(45) Date of Patent: Sep. 5, 2023

(54) DISPLAY DEVICE AND METHOD OF MANUFACTURING THE SAME

(71) Applicant: Samsung Display Co., Ltd., Gyeonggi-do (KR)

(72) Inventors: Jun Hong Park, Yongin-si (KR); Tae Gyun Kim, Yongin-si (KR); Jun Chun, Yongin-si (KR); Eui Suk Jung, Yongin-si (KR); Hyun Young Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 156 days.

(21) Appl. No.: 17/082,742

(22) Filed: Oct. 28, 2020

(65) Prior Publication Data

US 2021/0202803 A1    Jul. 1, 2021

(30) Foreign Application Priority Data

Dec. 30, 2019   (KR) .......................... 10-2019-0178428

(51) Int. Cl.
*H01L 33/56*    (2010.01)
*H01L 33/38*    (2010.01)
*H01L 33/00*    (2010.01)
*H01L 33/40*    (2010.01)

(52) U.S. Cl.
CPC ............ *H01L 33/56* (2013.01); *H01L 33/005* (2013.01); *H01L 33/38* (2013.01); *H01L 33/40* (2013.01); *H01L 2933/005* (2013.01); *H01L 2933/0016* (2013.01)

(58) Field of Classification Search
CPC combination set(s) only.
See application file for complete search history.

(56) References Cited

U.S. PATENT DOCUMENTS

| 10,490,537 | B2 | 11/2019 | Bae et al. | |
| 10,497,680 | B2 | 12/2019 | Sung et al. | |
| 2018/0012876 | A1* | 1/2018 | Kim | ....................... H01L 33/385 |
| 2018/0019369 | A1* | 1/2018 | Cho | .......................... H05K 1/11 |
| 2018/0175106 | A1* | 6/2018 | Kim | ....................... H01L 25/167 |
| 2019/0081261 | A1 | 3/2019 | Lee et al. | |
| 2019/0244985 | A1* | 8/2019 | Kim | ....................... H01L 27/124 |
| 2019/0378953 | A1* | 12/2019 | Min | ......................... H01L 33/38 |

FOREIGN PATENT DOCUMENTS

| KR | 10-2018-0007025 A | 1/2018 |
| KR | 10-1874993 B1 | 7/2018 |
| KR | 10-2019-0029831 A | 3/2019 |
| KR | 10-2019-0067296 A | 6/2019 |

* cited by examiner

*Primary Examiner* — Mark W Tornow
*Assistant Examiner* — Priya M Rampersaud
(74) *Attorney, Agent, or Firm* — Lewis Roca Rothgerber Christie LLP

(57) ABSTRACT

A display device and a manufacturing method thereof are disclosed. The display device may include a pixel circuit layer including a plurality of transistors, a first partition wall and a second partition wall on the pixel circuit layer, and each protruding in a thickness direction, a first electrode and a second electrode formed on the same layer, and on the first partition wall and the second partition wall, respectively; a light emitting element between the first electrode and the second electrode; and a first organic pattern directly on the light emitting element.

12 Claims, 31 Drawing Sheets

DISPLAY DEVICE AND METHOD OF MANUFACTURING THE SAME

CROSS-REFERENCE TO RELATED APPLICATION

This application claims priority to and the benefit of Korean patent application number 10-2019-0178428 filed on Dec. 30, 2019, the entire disclosure of which is incorporated herein by reference.

BACKGROUND

1. Field

Various embodiments of the present disclosure relate to a display device and a manufacturing method thereof.

2. Description of Related Art

The importance of a display device is increasing with the development of multimedia. Accordingly, various types of display devices such as an organic light emitting display (OLED) and a liquid crystal display (LCD) are being used.

A device for displaying an image of the display device includes a display panel such as an organic light emitting display panel or a liquid crystal display panel. The light emitting display panel may include a light emitting element. Examples of a light emitting diode (LED) may include an organic light emitting diode (OLED) using an organic material as a fluorescent material, and an inorganic light emitting diode using an inorganic material as a fluorescent material.

The inorganic light emitting diode using an inorganic semiconductor as the fluorescent material is durable even in a high-temperature environment, and is higher in efficiency of blue light as compared to organic light emitting diodes. Furthermore, a transfer method using a dielectrophoresis (DEP) method has been developed to overcome the limitations of an existing manufacturing process for an inorganic light emitting diode element. Thus, research into inorganic light emitting diodes having excellent durability and efficiency as compared to the organic light emitting diodes is being conducted.

SUMMARY

Various embodiments of the present disclosure are directed to a method of reducing the number of masks used when a display device including nano-scale to micro-scale light emitting elements is manufactured.

Furthermore, various embodiments of the present disclosure are directed to a display device having a generally flat upper surface.

The present disclosure is not limited to the above-described objects of embodiments, and other objects that are not mentioned will be clearly understood by those skilled in the art from the following description.

An embodiment of the present disclosure may provide a display device, including a pixel circuit layer including a plurality of transistors; a first partition wall and a second partition wall on the pixel circuit layer, and each protruding in a thickness direction; a first electrode and a second electrode formed on a same layer (e.g., on the same level), and on the first partition wall and the second partition wall, respectively; a light emitting element between the first electrode and the second electrode; and a first organic pattern directly on the light emitting element.

In an embodiment, the display device may further include a second organic pattern directly on the first electrode; and a third organic pattern directly on the second electrode.

The first organic pattern, the second organic pattern, and the third organic pattern may be on the same layer (e.g., on the same level).

The display device may further include a first contact electrode in contact with the first electrode and a first end of the light emitting element; and a second contact electrode in contact with the second electrode and a second end of the light emitting element.

The display device may further include a second organic pattern directly on the first electrode; and a third organic pattern directly on the second electrode, wherein the first contact electrode may be between the first organic pattern and the second organic pattern, and wherein the second contact electrode may be between the first organic pattern and the third organic pattern.

The first contact electrode may be located along an edge of a groove defined by the first organic pattern and the second organic pattern, and the second contact electrode may be located along an edge of a groove defined by the first organic pattern and the third organic pattern.

The display device may further include a fourth organic pattern directly on the first contact electrode; and a fifth organic pattern directly on the second contact electrode.

The fourth organic pattern and the fifth organic pattern may be on the same layer (e.g., on the same level).

Respective upper portions of the first organic pattern, the second organic pattern, the third organic pattern, the fourth organic pattern, and the fifth organic pattern may have the same (e.g., substantially the same) height.

The display device may further include an insulating layer on a portion of each of the first and second electrodes, wherein the insulating layer may expose another portion of each of the first and second electrodes.

The insulating layer may be between the first electrode and the second electrode, and the light emitting element may be on an area between the first electrode and the second electrode of the insulating layer.

The display device may further include a bank on the insulating layer, and having a height higher than that of the first and second partition walls.

The display device may further include a second organic pattern and a third organic pattern between the bank and the first organic pattern, and the first organic pattern, the second organic pattern, and the third organic pattern may be on the same layer (e.g., on the same level).

An embodiment of the present disclosure may provide a method of manufacturing a display device including a pixel circuit layer including a plurality of transistors, a first partition wall and a second partition wall on the pixel circuit layer and each protruding in a thickness direction, and a first electrode and a second electrode on the first partition wall and the second partition wall, respectively, the method including: aligning a light emitting element between the first electrode and the second electrode; forming a first organic layer including a first organic pattern directly on the light emitting element; and forming contact electrodes including a first contact electrode in contact with the first electrode and a first end of the light emitting element, and a second contact electrode in contact with the second electrode and a second end of the light emitting element.

The forming of the first organic layer may include forming a first organic material layer that covers the first electrode, the second electrode, and the light emitting element; and forming a first photo resist material and exposing a portion of the first organic material layer by applying the first photo resist material to the first organic material layer, and irradiating UV or laser light onto a portion of the first photo resist material.

After the forming of the first photo resist material and exposing, the first organic material layer may be separated into the first organic pattern, a second organic pattern, and a third organic pattern.

The first organic pattern may be directly on the first electrode, the second organic pattern may be directly on the second electrode, and the third organic pattern may be directly on the light emitting element.

The forming of the contact electrodes may include: forming a contact electrode material layer on each of the first organic pattern, the second organic pattern, and the third organic pattern; and coating a second organic material layer onto a portion of the contact electrode material layer and etching.

After the forming of the contact electrode, the contact electrode material layer may be separated into the first contact electrode and the second contact electrode.

The etching may be wet etching.

Additional details of other embodiments are included in the detailed description and drawings.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
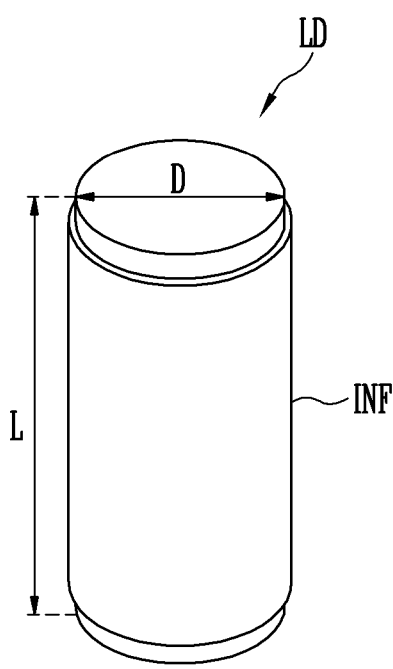
FIGS. 1 and 2 are a perspective view and a cross-sectional view illustrating a light emitting element in accordance with an embodiment of the present disclosure.

Features of the present disclosure, and methods for achieving the same will be apparent with reference to the embodiments described herein below in more detail together with the accompanying drawings. The subject matter of the present disclosure may, however, be embodied in many different forms and should not be construed as being limited to the embodiments set forth herein. Rather, these embodiments are provided so that this disclosure will be thorough and complete and will fully convey the concepts of the present disclosure to those skilled in the art, and the scope of the present disclosure will only be defined by the appended claims, and equivalents thereof.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first", "second", etc. may be used herein to describe various elements, these elements should not be limited by these terms. These terms are only used to distinguish one element from another element. Thus, a first element discussed below could be termed a second element without departing from the spirit and scope of the present disclosure. In the present disclosure, the singular forms are intended to include the plural forms as well, unless the context clearly indicates otherwise.

Herein, elements formed on the same layer may be elements that contain the same (e.g., substantially the same) material and are substantially simultaneously formed. Furthermore, elements formed on different layers may be formed at different times, and the elements may contain the same or different materials.

Hereinafter, embodiments of the present disclosure will be described in more detail with reference to the accompanying drawings. In the drawings, the same or similar reference numerals are used to designate the same or similar elements.

Figure 2:
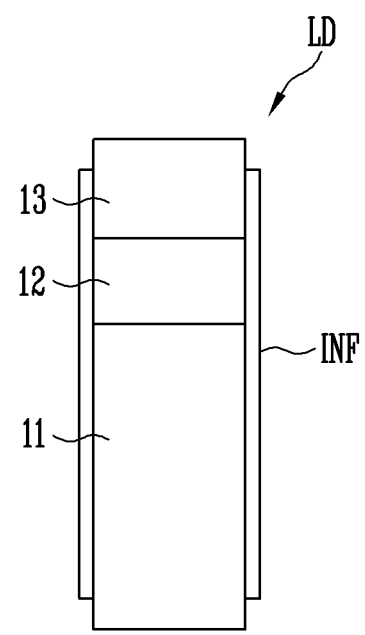

FIGS. 1 and 2 are a perspective view and a cross-sectional view illustrating a light emitting element in accordance with an embodiment of the present disclosure. Although a rod-type light emitting element LD of a cylindrical shape is illustrated in FIGS. 1 and 2, the type and/or shape of the light emitting element LD according to the present disclosure are not limited thereto.

Referring to FIGS. 1 and 2, the light emitting element LD may include a first conductive electrode layer 11, a second conductive electrode layer 13, and an active layer 12 interposed between the first and second conductive electrode layers 11 and 13. For example, the light emitting element LD may be a stacked body formed by successively stacking the first conductive electrode layer 11, the active layer 12, and the second conductive electrode layer 13 in one direction.

In an embodiment, the light emitting element LD may be in the form of a rod extending in one direction. The light emitting element LD may have a first end and a second end in one direction.

In an embodiment, one of the first and second conductive electrode layers 11 and 13 may be on the first end of the light emitting element LD, and the other of the first and second conductive electrode layers 11 and 13 may be on the second end of the light emitting element LD.

In an embodiment, the light emitting element LD may be a rod-type light emitting diode manufactured in the form of a rod. Here, the term "rod-like shape" embraces a rod-like shape and a bar-like shape such as a cylindrical shape and a prismatic shape that is longer in a longitudinal direction than in a width direction (e.g., to have an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a small size corresponding to a nano scale or a micro scale, e.g., a diameter D and/or a length L corresponding to a nano scale or micro scale range. For example, the light emitting element LD may have a length L and/or a diameter D of 1 nanometer (nm) to 5 micrometers (µm), such as, for example, 1 nm to 100 nm, 100 nm to 5 µm, or 100 nm to 800 nm. However, the size of the light emitting element LD is not limited to this. For example, the size of the light emitting element LD may be changed in various suitable ways depending on design conditions of various suitable devices, e.g., a display device, which employs, as a light source, a light emitting device using a light emitting element LD.

The first conductive electrode layer 11 may include at least one n-type semiconductor material. For instance, the first conductive electrode layer 11 may include an n-type semiconductor material which includes one semiconductor material selected from InAlGaN, GaN, AlGaN, InGaN, AlN, and InN, and is doped with a first conductive dopant such as Si, Ge, and/or Sn. However, the material forming the first conductive electrode layer 11 is not limited to this, and the first conductive electrode layer 11 may be formed of various other suitable materials.

The active layer 12 may be on the first conductive electrode layer 11 and have a single or multiple quantum well structure. In an embodiment, a cladding layer doped with a conductive dopant may be on and/or under the active layer 12. For example, the cladding layer may include an AlGaN layer and/or an InAlGaN layer. In an embodiment, a material such as AlGaN and/or AlInGaN may be used to form the active layer 12, and various other suitable materials may be used to form the active layer 12.

If a voltage of a threshold voltage or more is applied to the opposite ends of the light emitting element LD, the light emitting element LD may emit light by coupling (e.g., recombination) of electron-hole pairs in the active layer 12. Because light emission of the light emitting element LD can be controlled based on the foregoing principle, the light emitting element LD may be used as a light source of various suitable light emitting devices as well as a pixel of the display device.

The second conductive electrode layer 13 may be on the active layer 12 and include a semiconductor material of a type different from that of the first conductive electrode layer 11. For example, the second conductive electrode layer 13 may include at least one p-type semiconductor material. For instance, the second conductive electrode layer 13 may include a p-type semiconductor material which includes at least one semiconductor material selected from InAlGaN, GaN, AlGaN, InGaN, AlN, and InN, and is doped with a second conductive dopant such as Mg. However, the material forming the second conductive electrode layer 13 is not limited to this, and the second conductive electrode layer 13 may be formed of various other suitable materials.

In an embodiment, the light emitting element LD may further include an insulating film INF provided on the surface of the light emitting element LD. The insulating film INF may be on the surface of the light emitting element LD to enclose a periphery (e.g., an outer circumferential surface) of at least the active layer 12. In addition, the insulating film INF may further enclose an area of each of the first and second conductive electrode layers 11 and 13. The insulating film INF may allow the opposite ends of the light emitting element LD that have different polarities to be exposed to the outside. For example, the insulating film INF may expose one end of each of the first and second conductive electrode layers 11 and 13 that are on the respective opposite ends of the light emitting element LD with respect to the longitudinal direction, e.g., may expose two surfaces (e.g., top and bottom surfaces) of the cylinder rather than covering them.

In an embodiment, the insulating film INF may include at least one insulating material selected from silicon dioxide ($SiO_2$), silicon nitride ($Si_3N_4$), aluminum oxide ($Al_2O_3$), and titanium dioxide ($TiO_2$), but it is not limited thereto. In other words, the material forming the insulating film INF is not limited to a particular material, and the insulating film INF may be formed of various suitable insulating materials generally available in the art.

In an embodiment, the light emitting element LD may further include additional other components as well as the first conductive electrode layer 11, the active layer 12, the second conductive electrode layer 13, and/or the insulating film INF. For example, the light emitting element LD may further include at least one fluorescent layer, at least one active layer, at least one semiconductor material and/or at least one electrode layer on one end of the first conductive electrode layer 11, the active layer 12, and/or the second conductive electrode layer 13.

Figure 3:
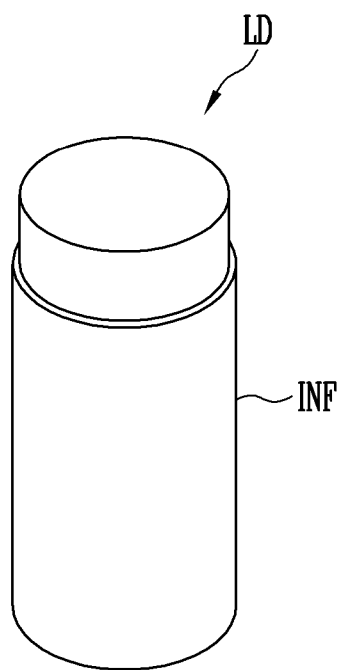
FIGS. 3 and 4 are a perspective view and a cross-sectional view illustrating a light emitting element in accordance with an embodiment of the present disclosure.
Figure 4:
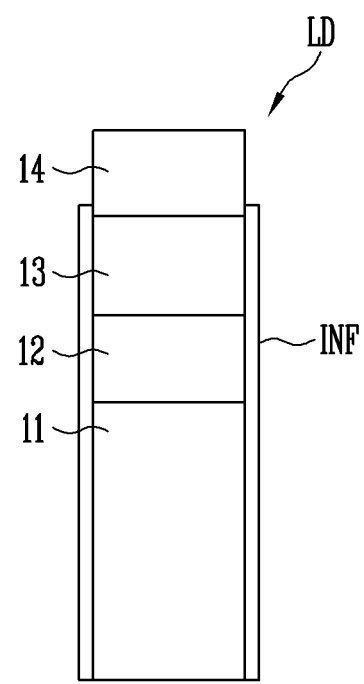
Figure 5:
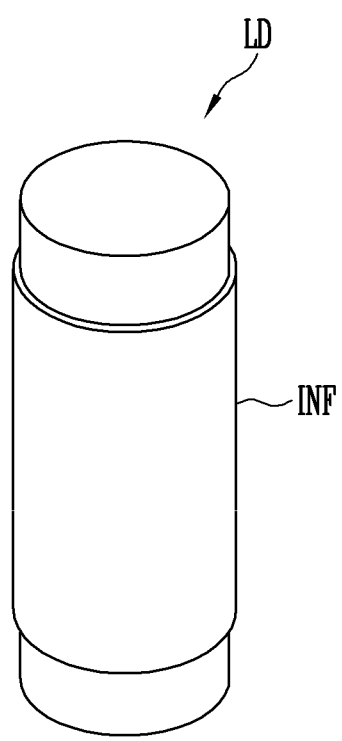
FIGS. 5 and 6 are a perspective view and a cross-sectional view illustrating a light emitting element in accordance with an embodiment of the present disclosure.
Figure 6:
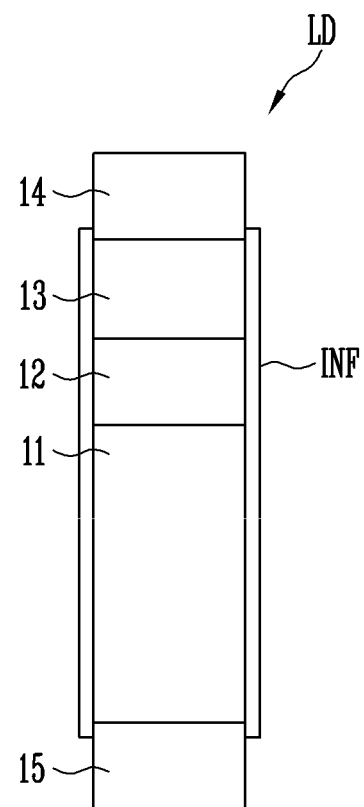

FIGS. 3 and 4 are a perspective view and a cross-sectional view illustrating a light emitting element in accordance with an embodiment of the present disclosure. FIGS. 5 and 6 are a perspective view and a cross-sectional view illustrating a light emitting element in accordance with an embodiment of the present disclosure.

Referring to FIGS. 3 and 4, the light emitting element LD may further include at least one electrode layer 14 on one end of the second conductive electrode layer 13.

Referring to FIGS. 5 and 6, the light emitting element LD may further include at least one electrode layer 15 on one end of the first conductive electrode layer 11.

Each of the electrode layers 14 and 15 may be an ohmic contact electrode, but it is not limited thereto. Furthermore, each of the electrode layers 14 and 15 may include a metal and/or a conductive metal oxide. For example, each of the electrode layers 14 and 15 may be formed of transparent electrode materials such as chromium (Cr), titanium (Ti), aluminum (Al), gold (Au), nickel (Ni), oxides and/or alloys thereof, indium tin oxide (ITO), indium zinc oxide (IZO), zinc oxide (ZnO), and/or indium tin zinc oxide (ITZO) alone or in combination. The electrode layers 14 and 15 may be substantially transparent or semitransparent. Thereby, light generated from the light emitting element LD may be emitted to the outside of the light emitting element LD after passing through the electrode layers 14 and 15.

In an embodiment, the insulating film INF may at least partially enclose the outer surfaces of the electrode layers 14 and 15, or may not enclose them. In other words, the insulating film INF may be selectively formed on the surfaces of the electrode layers 14 and 15. Furthermore, the insulating layer INF may be formed to expose the opposite ends of the light emitting element LD that have different polarities, for example, may expose at least an area of each of the electrode layers 14 and 15. However, without being limited thereto, the insulating film INF may not be provided.

If the insulating film INF is provided on the surface of the light emitting element LD, for example, on the surface of the active layer 12, a short-circuit between the active layer 12 and at least one electrode, e.g., at least one contact electrode of contact electrodes coupled to the opposite ends of the light emitting element LD, etc. may be prevented or a likelihood or degree thereof may be reduced. Consequently, the electrical stability of the light emitting element LD may be secured.

Furthermore, the insulating film INF may be formed on the surface of the light emitting element LD, thus minimizing or reducing surface defects of the light emitting element LD and improving the lifespan and efficiency of the light emitting element LD. Moreover, the insulating film INF is formed on the light emitting element LD, thus preventing or reducing a likelihood or degree of an undesired short circuit between the light emitting elements LD from occurring even if multiple light emitting elements LD are arranged in close proximity to each other.

In an embodiment, the light emitting element LD may be manufactured through a surface treatment process (e.g. coating). For example, when the plurality of light emitting elements LD is mixed with fluid solution (or solvent) to be supplied to each light emitting area (e.g. light emitting area of each pixel), the light emitting elements LD may be uniformly dispersed without being non-uniformly aggregated in the solution. Here, the light emitting area is an area in which light is emitted by the light emitting elements LD. The light emitting area may be distinguished from a non-light-emitting area in which light is not emitted.

In some embodiments, the insulating film INF itself may be formed of a hydrophobic film using a hydrophobic material, or the hydrophobic film of the hydrophobic material may be further formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). In this case, the hydrophobic material may include octadecyl trichlorosilane, fluoroalkyl trichlorosilane, perfluoroalkyl triethoxysilane, etc. Furthermore, the hydrophobic material may be a commercially available fluorine containing material such as Teflon™ and/or Cytop™, and/or a corresponding material.

A light emitting device including the light emitting element LD described above may be used in various suitable devices including a display device which utilizes a light source. For instance, at least one subminiature light emitting element LD, e.g., a plurality of subminiature light emitting elements LD each having a size ranging from a nano scale to a micro scale, may be in each pixel area of the display panel to form a light source (or, a light source unit) of the corresponding pixel using the subminiature light emitting elements LD. Furthermore, the field of application of the light emitting element LD according to the present disclosure is not limited to the display device. For example, the light emitting element LD may also be used in various suitable devices such as a lighting device, which utilizes a light source.

Figure 7:
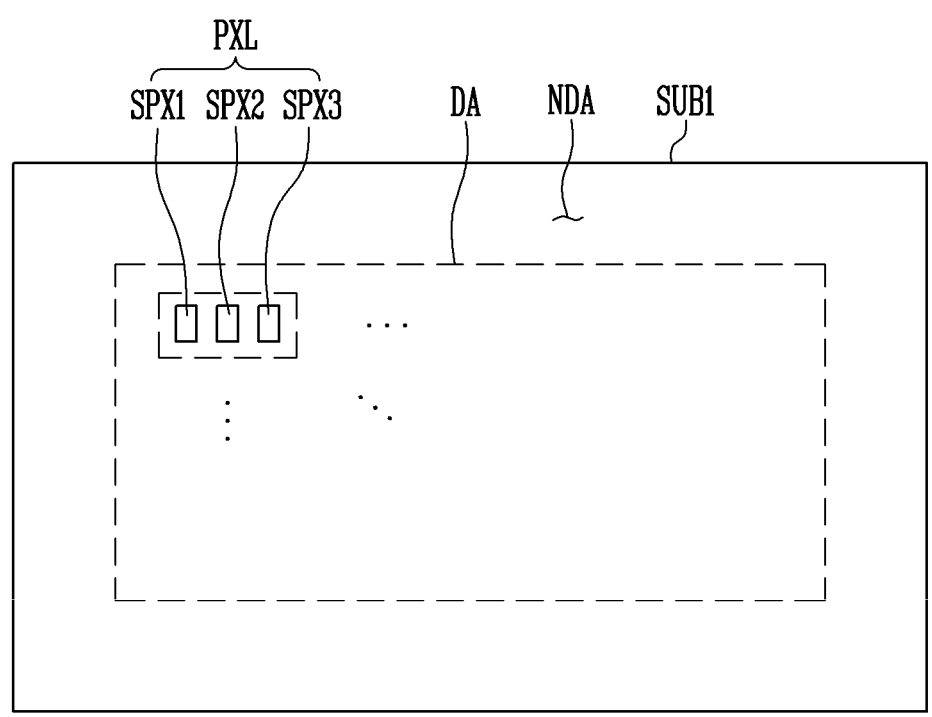
FIG. 7 is a conceptual view illustrating a display panel in accordance with an embodiment of the present disclosure.
Figure 7:
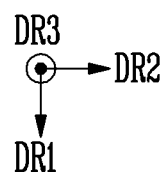

FIG. 7 is a conceptual view illustrating a display panel in accordance with an embodiment of the present disclosure. According to an embodiment, FIG. 7 illustrates the display panel that may use the light emitting elements LD of FIGS. 1 to 6 as the light source.

The display panel may be used as a display panel of a large display device such as a television or a monitor and small and medium display devices such as a mobile phone, a tablet, a car navigation device, a game console, and/or a smart watch.

In an embodiment, the display panel may have the shape of a rectangle that is longer in a second direction DR2 than in a first direction DR1. The thickness direction of the display panel is indicated by a third direction DR3. However, because the directions indicated by the first to third directions DR1, DR2, and DR3 are relative concepts, each direction may be converted into another direction. Hereinafter, the first to third directions DR1, DR2, and DR3 refer to the same reference numerals in the directions indicated by the first to third directions DR1, DR2, and DR3, respectively. The display panel may have various suitable shapes without being limited to the shape shown in the drawings.

The display panel may include a base layer (or substrate) SUB1, and pixels PXL on the base layer SUB1. In more detail, the display panel and the base layer SUB1 may include a display area DA to display an image, and a non-display area NDA formed in a set or predetermined area other than the display area DA.

The display area DA and the non-display area NDA may be defined in the substrate SUB1. In an embodiment, the display area DA may be in a central portion of the display panel, and the non-display area NDA may be in a perimeter portion of the display panel to enclose the display area DA. The locations of the display area DA and the non-display area NDA are not limited to this, and the locations thereof may be changed.

The base layer SUB1 may form a base member of the display panel. For example, the base layer SUB1 may form a base member of a lower panel (e.g., a lower plate of the display panel).

In an embodiment, the base layer SUB1 may be a rigid or flexible substrate, and the material or properties thereof are not particularly limited. For example, the base layer SUB1 may be a rigid substrate made of glass or reinforced glass, or a flexible substrate formed of a thin film made of plastic or metal. Furthermore, the base layer SUB1 may be a transparent substrate, but it is not limited thereto. For instance, the base layer SUB1 may be a translucent substrate, an opaque substrate, or a reflective substrate.

An area on the base layer SUB1 is defined as the display area DA in which the pixels PXL are located, and the other area thereof is defined as the non-display area NDA. For example, the base layer SUB1 may include the display area DA including a plurality of light emitting areas on which the pixels PXL are formed, and the non-display area NDA located around the display area DA. Various suitable lines and/or internal circuits which are coupled to the pixels PXL of the display area DA may be in the non-display area NDA.

Each of the pixels PXL may include at least one light emitting element LD (e.g., at least one rod-type light emitting diode according to any one of embodiments illustrated in FIGS. 1 to 6) which is driven by a corresponding scan signal and a data signal. For example, the pixel PXL may include a plurality of rod-type light emitting diodes, each of which has a small size ranging from a nano scale to a micro scale, which are coupled in parallel to each other. The plurality of rod-type light emitting diodes may form a light source of the pixel PXL.

Furthermore, the pixel PXL may include a plurality of sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit light of different colors, respectively. For instance, the first sub-pixel SPX1 may be a red sub-pixel to emit red light, the second sub-pixel SPX2 may be a green sub-pixel to emit green light, and the third sub-pixel SPX3 may be a blue sub-pixel to emit blue light. However, the colors, types and/or number of sub-pixels forming the pixel PXL are not particularly limited. For example, the color of light which is emitted from each of the sub-pixels SPX1, SPX2, and SPX3 may be changed in various suitable ways. Although in FIG. 7 there is illustrated an embodiment where the sub-pixels SPX1, SPX2, and SPX3 are arranged in the display area DA in a stripe shape, the present disclosure is not limited thereto. For example, the pixels PXL may be arranged in various suitable pixel array forms that are generally used in the art.

In an embodiment, each of the sub-pixels SPX1, SPX2, and SPX3 may include a plurality of unit pixels SSPX1, SSPX2, and SSPX3.

In some embodiments, a plurality of pads may be in the non-display area NDA. Lines in the display panel may be electrically coupled to a driver IC located outside the display panel through the pads.

Figure 8:
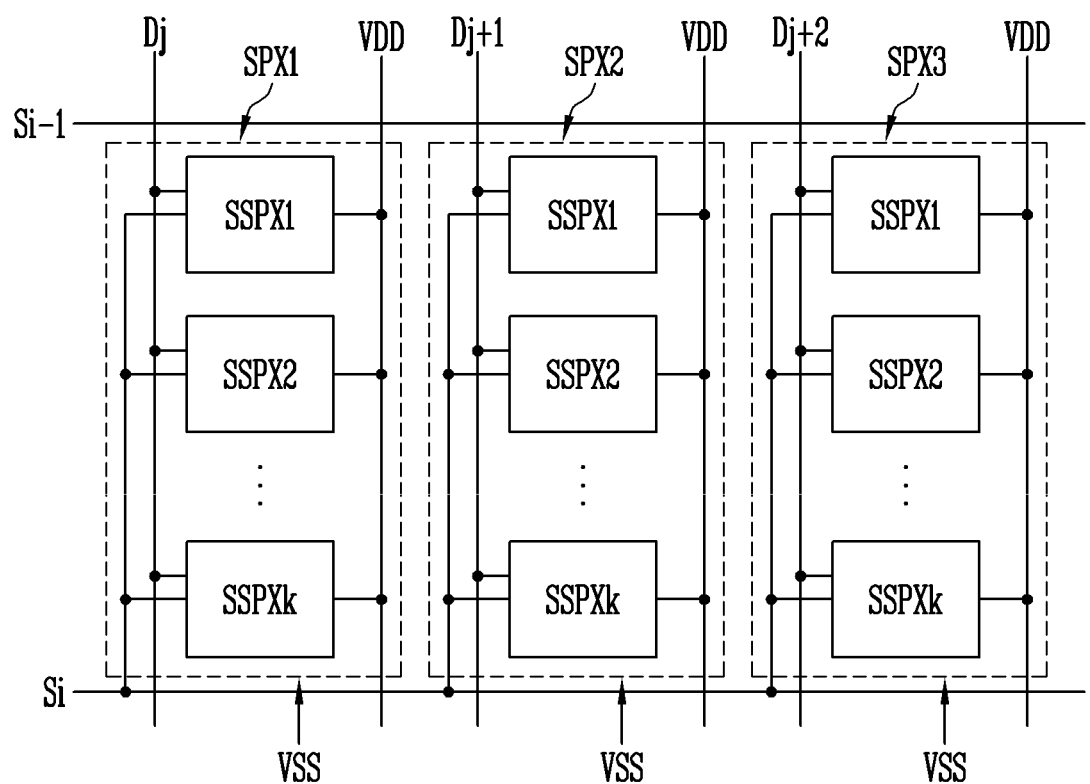
FIG. 8 is a circuit diagram illustrating an example of a sub-pixel included in the display panel of FIG. 7.

FIG. 8 is a circuit diagram illustrating an example of the sub-pixel included in the display panel of FIG. 7. FIG. 8 illustrates the first to third sub-pixels SPX1, SPX2, and SPX3 included in the display panel of FIG. 7.

Because the first to third sub-pixels SPX1, SPX2, and SPX3 are substantially equal to each other except that the first to third sub-pixels SPX1, SPX2, and SPX3 are coupled to corresponding data lines Dj, Dj+1, and Dj+2, respectively, the first to third sub-pixels SPX1, SPX2, and SPX3 will be described based on the first sub-pixel SPX1.

The first to third sub-pixels SPX1, SPX2, and SPX3 may be in areas, respectively, which are partitioned by scan lines Si−1 and Si (i is a natural number) and data lines Dj, Dj+1, and Dj+2 (j is a natural number). For example, the first sub-pixel SPX1 may be in an area defined by i−1-th and i-th scan lines Si−1 and Si and j-th and j+1-th data lines Dj and Dj+1. However, the arrangement of the first to third sub-pixels SPX1, SPX2, and SPX3 is not limited thereto.

The first sub-pixel SPX1 may be coupled to the scan line Si and the data line Dj, and also be coupled to a first power supply line and a second power supply line. Here, a first power supply VDD may be applied to the first power supply line, and a second power supply VSS may be applied to the second power supply line. Each of the first and second power supply lines may be a common line coupled to the plurality of sub-pixels. The first and second power supplies VDD and VSS may have different potentials to allow the first sub-pixel SPX1 to emit light. The first power supply VDD may have a voltage level higher than that of the second power supply VSS.

In an embodiment, the first sub-pixel SPX1 may include at least one unit pixel SSPX1 to SSPXk (k is a natural number).

Each of the unit pixels SSPX1 to SSPXk may be coupled to the scan line Si and the data line Dj, and also be coupled to the first power supply line and the second power supply line. Each of the unit pixels SSPX1 to SSPXk may emit light having a luminance corresponding to a data signal transmitted through the data line Dj in response to a scan signal transmitted through the scan line Si. The unit pixels SSPX1 to SSPXk may include substantially the same pixel structure or pixel circuit.

In other words, the first sub-pixel SPX1 may include unit pixels SSPX1 to SSPXk that independently emit light, in response to one scan signal and one data signal.

In an embodiment, each of the unit pixels SSPX1 to SSPXk (or sub-pixels SPX1 to SPX3) may be an active pixel. However, the type, structure, and/or driving scheme of the unit pixel capable of being applied to the display panel of the present disclosure are not particularly limited. For example, the unit pixel may be configured as the pixel of the display panel having various suitable passive or active structures that are generally used in the art.

FIGS. 9 to 12 are circuit diagrams illustrating an example applicable to the unit pixel included in the sub-pixel of FIG. 8.

Each drawing will be described with reference to one unit pixel. Because the description of the first to the k-th unit pixels SSPX1 to SSPXk shown in FIG. 8 may be applied to FIGS. 9 to 12, duplicative description thereof will not be here. For example, the first to the k-th unit pixels SSPX1 to SSPXk shown in FIG. 8 have substantially the same or similar structure. The first unit pixel SSPX1 shown in FIGS. 9 to 12 is illustrative, and may be equally or similarly applied to any one of the first to the k-th unit pixels SSPX1 to SSPXk of FIG. 8.

Figure 9:
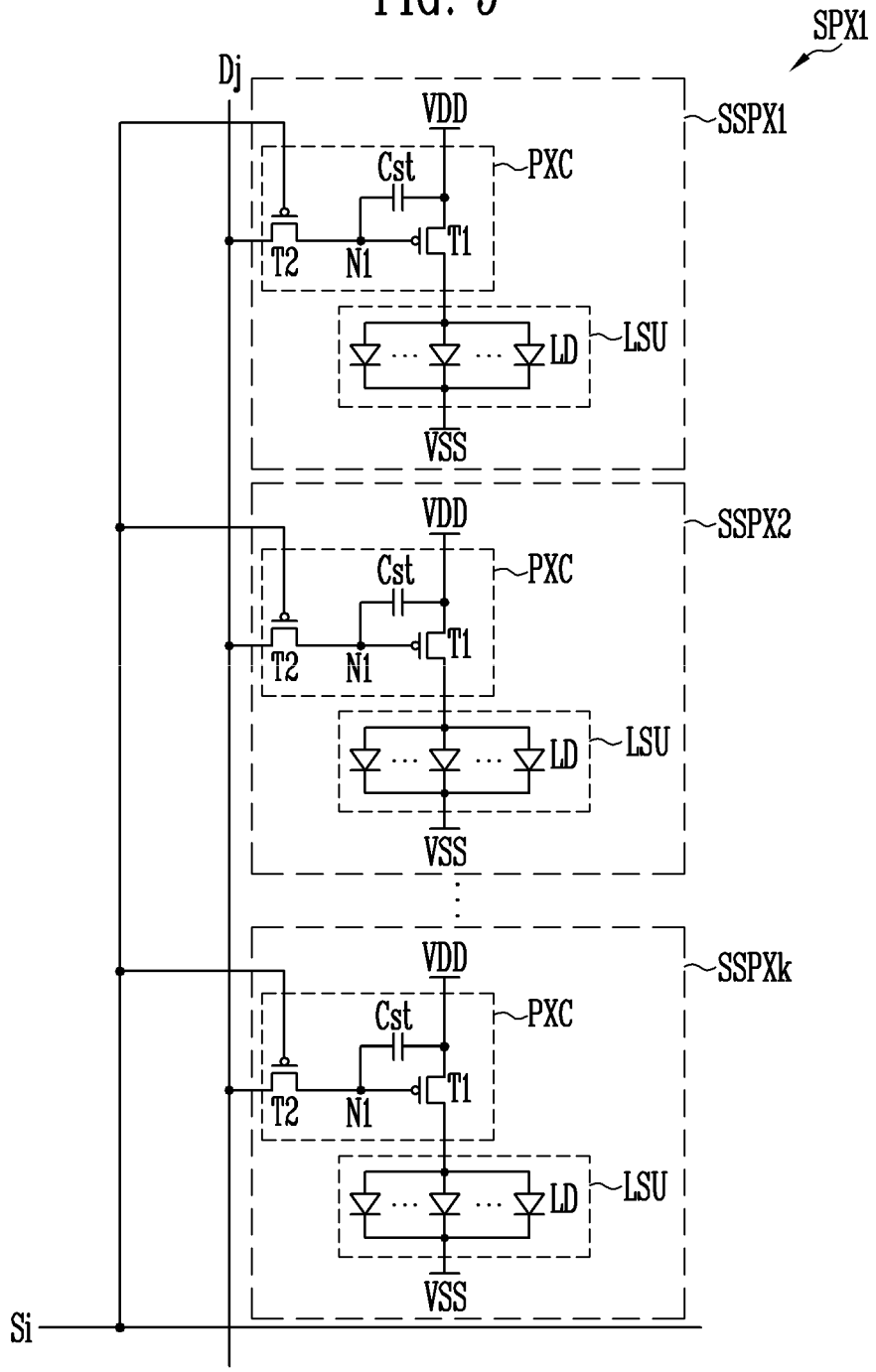
FIGS. 9 to 12 are circuit diagrams illustrating an example applicable to a unit pixel included in the sub-pixel of FIG. 8.

First, referring to FIG. 9, the unit pixel SSPX1 may include a light source unit LSU that emits light having a luminance corresponding to the data signal. The unit pixel SSPX1 may selectively further include a pixel circuit PXC to drive the light source unit LSU.

In an embodiment, the light source unit LSU may include a plurality of light emitting elements LD that are electrically coupled to each other between the first power supply VDD and the second power supply VSS. In an embodiment, the light emitting elements LD may be coupled in parallel to each other, without being limited thereto. For example, the plurality of light emitting elements LD may be coupled in parallel between the first power supply VDD and the second power supply VSS.

The first and second power supplies VDD and VSS may have different potentials to allow the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more at least during a light emitting period of the unit pixel SSPX1 (or first sub-pixel SPX1).

Although in FIG. 9 there is illustrated an embodiment in which the light emitting elements LD are coupled in parallel in the same (e.g., substantially the same) direction (e.g., in a forward direction) between the first power supply VDD and the second power supply VSS, the present disclosure is not limited to this. For example, some of the light emitting elements LD may be coupled to each other in the forward direction between the first and second power supplies VDD and VSS, thus forming respective effective light sources, and the other light emitting elements LD may be coupled to each other in the reverse direction. As another example, the unit pixel SSPX1 may include only a single light emitting element LD (e.g. single effective light source coupled in the forward direction between the first and second power supplies VDD and VSS).

According to an embodiment, the first end of each of the light emitting elements LD may be coupled in common to an associated pixel circuit PXC through a first electrode, and may be coupled to the first power supply VDD through the pixel circuit PXC and the first power supply line. The second end of each of the light emitting elements LD may be coupled in common to the second power supply VSS through the second electrode and the second power supply line.

The light source unit LSU may emit light having a luminance corresponding to a driving current supplied thereto through the corresponding pixel circuit PXC. Thereby, a set or predetermined image may be displayed on the display area DA (see FIG. 4).

The pixel circuit PXC may be coupled to the scan line Si and the data line Dj of the corresponding sub-pixel (e.g., first sub-pixel SPX1). For example, if the first sub-pixel SPX1 is on an i-th row and a j-th column of the display area DA, the pixel circuit PXC of the unit pixel SSPX may be coupled to the i-th scan line Si and the j-th data line Dj of the display area DA.

The pixel circuit PXC may include a first transistor T1, a second transistor T2, and a storage capacitor Cst.

The first transistor (or driving transistor) T1 may be coupled between the first power supply VDD and the light source unit LSU. A gate electrode of the first transistor T1 may be coupled to the first node N1. The first transistor T1 may control driving current to be supplied to the light source unit LSU in response to a voltage of the first node N1.

The second transistor (or switching transistor) T2 may be coupled between the data line Dj and the first node N1. A gate electrode of the second transistor T2 may be coupled to the scan line Si.

In response to a scan signal of a gate-on voltage (e.g., a low voltage) supplied from the scan line Si, the second transistor T2 may be turned on to electrically couple the first node N1 to the data line Dj.

During a frame period, a data signal of a corresponding frame is supplied to the data line Dj. The data signal may be transmitted to the first node N1 via the second transistor T2. Thereby, a voltage corresponding to the data signal may be charged to the storage capacitor Cst.

The first electrode of the storage capacitor Cst may be coupled to the first power supply VDD, and the second electrode thereof may be coupled to the first node N1. The storage capacitor Cst may charge voltage corresponding to a data signal supplied to the first node N1 during each frame period, and maintain the charged voltage until a data signal of a subsequent frame is supplied.

Although in FIG. 9 the transistors, e.g., the first and second transistors T1 and T2, included in the pixel circuit PXC have been illustrated as being formed of P-type transistors, the present disclosure is not limited to this. For example, any one of the first and second transistors T1 and T2 may be changed to an N-type transistor.

Figure 10:
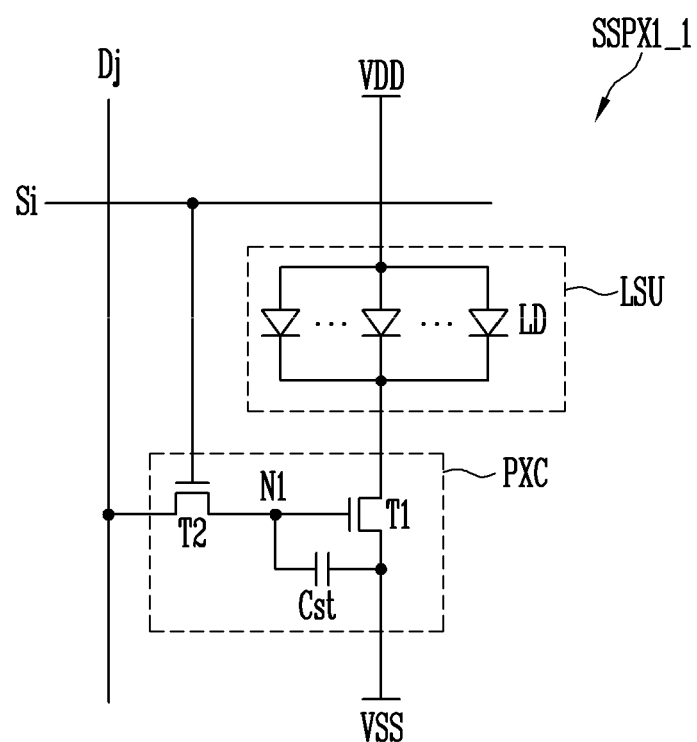

For example, as shown in FIG. 10, both the first and second transistors T1 and T2 may be formed of N-type transistors. In this case, the gate-on voltage of the scan signal for writing the data signal supplied to the data line Dj in each frame period in the unit pixel SSPX1_1 may be a high level voltage. Similarly, the voltage of the data signal for turning on the first transistor T1 may be a waveform voltage opposite to that of the embodiment of FIG. 9. By way of example, in the embodiment of FIG. 10, as a gray scale value that is to be expressed increases, a data signal having a higher voltage level may be supplied.

The unit pixel SSPX1_1 shown in FIG. 10 is substantially similar in configuration and operation to the unit pixel SSPX1 of FIG. 9, except that the connection positions of some circuit elements and the voltage levels of control signals (e.g. scan signal and data signal) are changed depending on a change in transistor type. Therefore, duplicative description of the unit pixel SSPX1_1 of FIG. 10 will not be repeated here.

The structure of the pixel circuit PXC is not limited to the embodiments shown in FIGS. 9 and 10. In other words, the pixel circuit PXC may be formed of any suitable pixel circuit generally used in the art, which may have various suitable structures and/or be operated by various suitable driving schemes. For example, the pixel circuit PXC may be configured in the same (e.g., substantially the same) manner as that of an embodiment illustrated in FIG. 11.

Figure 11:
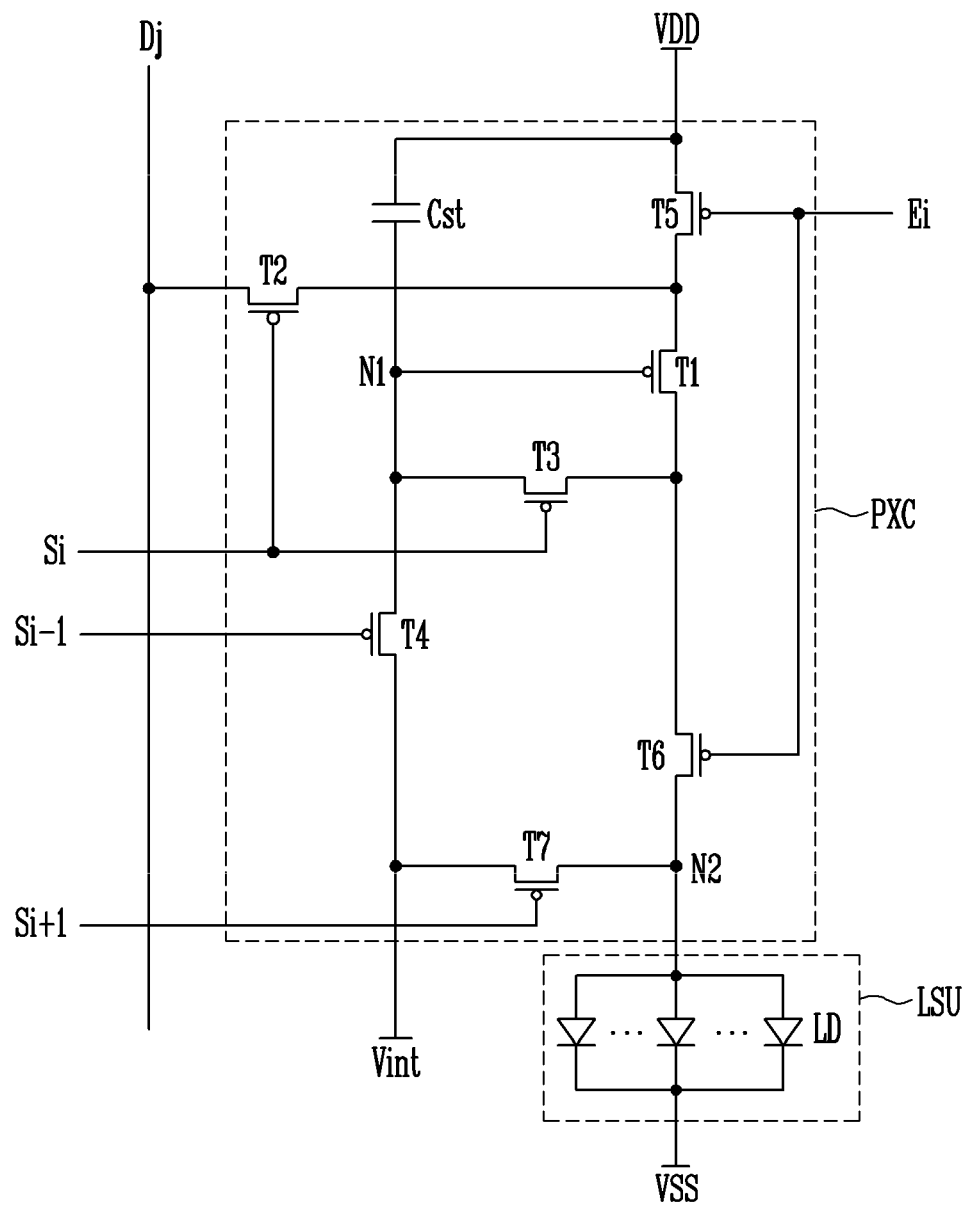

Referring to FIG. 11, the pixel circuit PXC in the unit pixel SSPX1_2 may be coupled not only to a corresponding scan line Si but also to at least one another scan line (or a control line). For example, the pixel circuit PXC of the sub-pixel SPX (or the unit pixel SSPX included therein) on the i-th row of the display area DA may be further coupled to an i−1-th scan line Si−1 and/or an i+1-th scan line Si+1. In an embodiment, the pixel circuit PXC may be coupled not only to the first and second power supplies VDD and VSS but also to other power supplies. For example, the pixel circuit PXC may also be coupled to an initialization power supply Vint.

According to an embodiment, the pixel circuit PXC may include seven transistors T1 to T7. The pixel circuit PXC may include first to seventh transistors T1 to T7 and a storage capacitor Cst.

The first transistor T1 may be coupled between the first power supply VDD and the light source unit LSU. The first electrode (e.g. source electrode) of the first transistor T1 may be coupled to the first power supply VDD through the fifth transistor T5, and the second electrode (e.g. drain electrode) of the first transistor T1 may be coupled via the sixth transistor T6 to the first electrode (e.g. first electrode of the corresponding sub-pixel SPX) of the light source unit LSU. The gate electrode of the first transistor T1 may be coupled to the first node N1. The first transistor T1 may control driving current to be supplied to the light source unit LSU in response to a voltage of the first node N1.

The second transistor T2 may be coupled between the data line Dj and the first electrode of the first transistor T1. The gate electrode of the second transistor T2 may be coupled to the corresponding scan line Si. When a scan signal of a gate-on voltage is supplied from the scan line Si, the second transistor T2 may be turned on to electrically couple the data line Dj to the first electrode of the first transistor T1. Hence, if the second transistor T2 is turned on, a data signal supplied from the data line Dj may be transmitted to the first transistor T1.

The third transistor T3 may be coupled between the second electrode (e.g. drain electrode) of the first transistor T1 and the first node N1. The gate electrode of the third transistor T3 may be coupled to the corresponding scan line Si. When a scan signal of a gate-on voltage is supplied from the scan line Si, the third transistor T3 may be turned on to couple the first transistor T1 in the form of a diode.

The fourth transistor T4 may be coupled between the first node N1 and an initialization power supply Vint. A gate electrode of the fourth transistor T4 may be coupled to a preceding scan line, e.g., an i−1-th scan line Si−1. When a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum or lower voltage of a data signal or less.

The fifth transistor T5 may be coupled between the first power supply VDD and the first transistor T1. A gate electrode of the fifth transistor T5 may be coupled to a corresponding emission control line, e.g., an i-th emission control line Ei. The fifth transistor T5 may be turned off when an emission control signal of a gate-off voltage (e.g., a high voltage) is supplied to the emission control line Ei, and may be turned on in other cases.

The sixth transistor T6 may be coupled between the first transistor T1 and the first electrode of the light source unit LSU. A gate electrode of the sixth transistor T6 may be coupled to a corresponding emission control line, e.g., an i-th emission control line Ei. The sixth transistor T6 may be turned off when an emission control signal of a gate-off voltage is supplied to the emission control line Ei, and may be turned on in other cases.

The seventh transistor T7 may be coupled between the first electrode of the light source unit LSU and the initialization power supply Vint (or third power supply line transmitting initialization power). A gate electrode of the seventh transistor T7 may be coupled to any one of scan lines of a subsequent stage, e.g., to the i+1-th scan line Si+1. When a scan signal of a gate-on voltage is supplied to the i+1-th scan line Si+1, the seventh transistor T7 may be turned on so that the voltage of the initialization power supply Vint may be supplied to the first electrode of the light source unit LSU. In this case, during an initialization period when the voltage of the initialization power supply Vint is transmitted to the power source unit LSU, the voltage of the first electrode of the light source unit LSU may be initialized.

The control signal for controlling the operation of the seventh transistor T7 may be variously changed. For example, the gate electrode of the seventh transistor T7 may be coupled to a scan line of a corresponding horizontal line, namely, an i-th scan line Si. In this case, when a scan signal of a gate-on voltage is supplied to the i-th scan line Si, the seventh transistor T7 may be turned on so that the voltage of the initialization power supply Vint may be supplied to the first electrode of the light source unit LSU.

The storage capacitor Cst may be coupled between the first power supply VDD and the first node N1. The storage capacitor Cst may store a voltage corresponding both to the data signal applied to the first node N1 during each frame period and to the threshold voltage of the first transistor T1. A second node N2 may also be coupled to the first power supply VDD.

Although in FIG. 11 the transistors, e.g., the first to seventh transistors T1 to T7, included in the pixel circuit PXC in the unit pixel SSPX1_2 have been illustrated as being formed of P-type transistors, the present disclosure is not limited to this. For example, at least one of the first to seventh transistors T1 to T7 may be changed to an N-type transistor.

According to an embodiment, the pixel circuit PXC may be further coupled to another line as well as the data line Dj.

Figure 12:
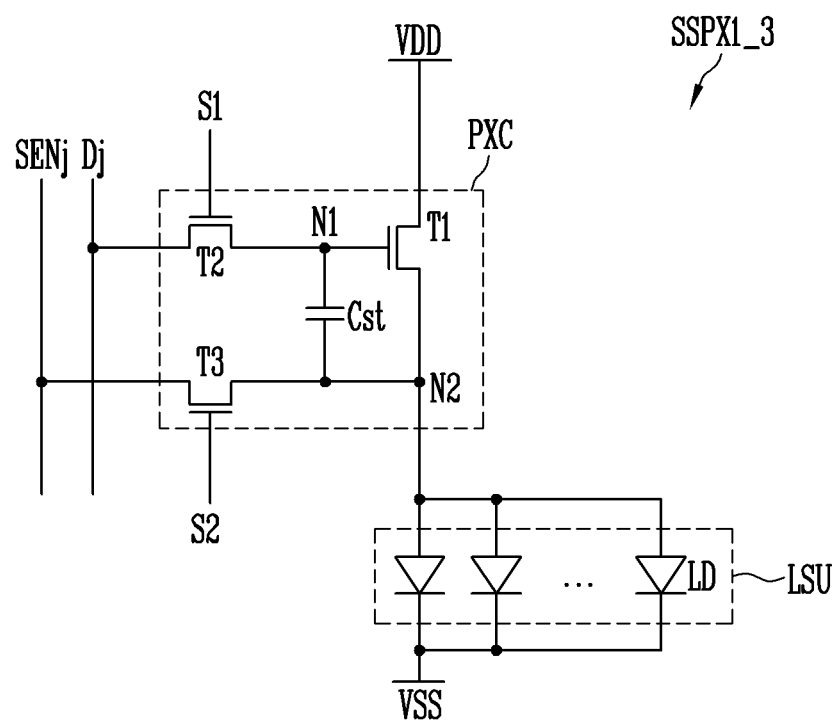

Referring to FIG. 12, the pixel circuit PXC in the unit pixel SSPX1_3 may be coupled to a sensing line SENj. The pixel circuit PXC may include first to third transistors T1 to T3 and a storage capacitor Cst. Because the first and second transistors T1 and T2 and the storage capacitor Cst are substantially equal or similar to the first and second transistors T1 and T2 and the storage capacitor Cst described with reference to FIG. 10, a duplicative description thereof will not be repeated here.

The third transistor T3 may be coupled between the sensing line SENj and the second node N2. The gate electrode of the third transistor T3 may be coupled to the first scan line S1 and another second scan line S2 (e.g. j-th scan line Sj and another j+1-th scan line Sj+1).

The light source unit LSU may be coupled between the second node N2 and the second power supply line (e.g., power supply line to which the second power supply VSS is applied).

The third transistor T3 may be turned on in response to the scan signal of the gate-on voltage transmitted from the second scan line S2 to electrically couple the sensing line SENj to the second node N2.

For example, when the third transistor T3 is turned on with driving current corresponding to reference voltage flowing in the first transistor T1, the driving current flowing through the first transistor T1 may be provided to an external sensing device through the third transistor T3 and the sensing line SENj, and a signal corresponding to the characteristics of the first transistor T1 (e.g. Vth) on the basis of the driving current may be output through the sensing line SENj to an outside.

Furthermore, the structure of the unit pixel SSPX1 which may be applied to the present disclosure is not limited to the embodiments illustrated in FIGS. 9 through 12, and the unit pixel SSPX1 may have various suitable structures. For example, the pixel circuit PXC included in the unit pixel SSPX1 may be formed of any suitable pixel circuit generally used in the art, which may have various suitable structures and/or be operated by various suitable driving schemes. The unit pixel SSPX1 may be formed in a passive light emitting display panel or the like. In this case, the pixel circuit PXC may be omitted, and each of the first and second pixel electrodes of the light source unit LSU may be directly coupled to the scan line Si, the data line Dj, a power supply line, and/or the control line.

Figure 13:
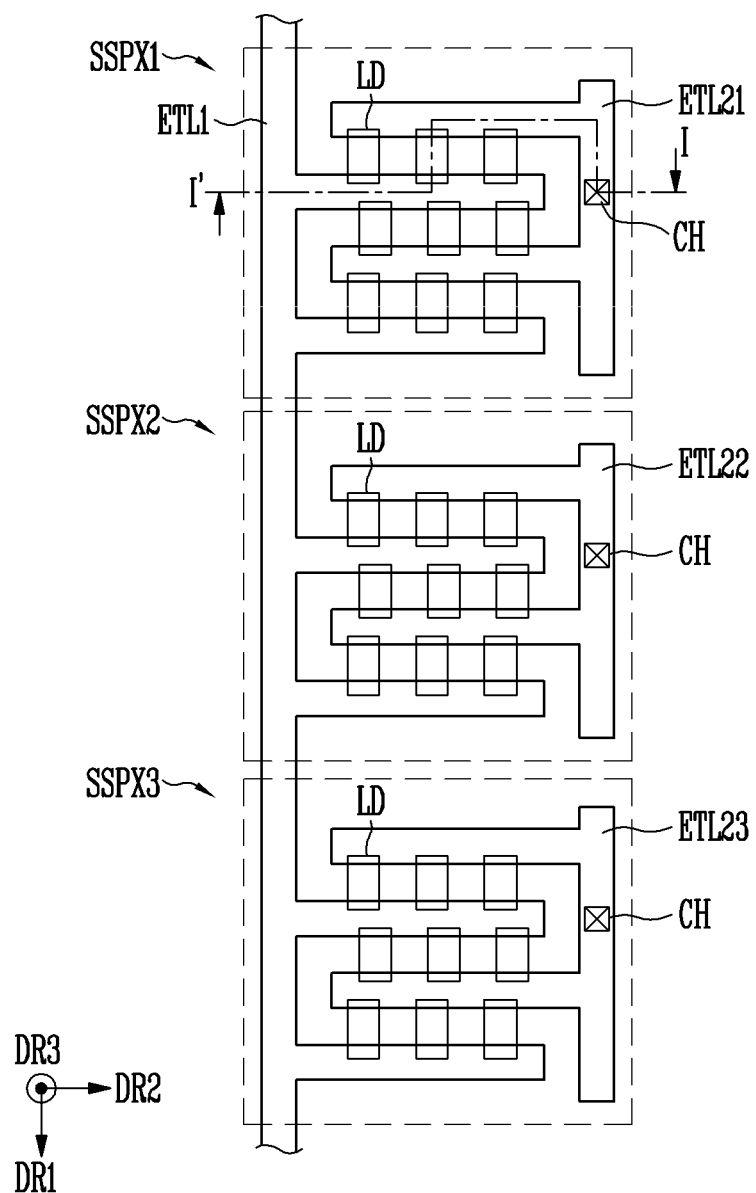
FIG. 13 is a planar layout diagram illustrating the arrangement of some components in one sub-pixel included in the display panel of FIG. 7.

FIG. 13 is a planar layout diagram illustrating the arrangement of some components in one sub pixel included in the display panel of FIG. 7. FIG. 13 illustrates the structure of the unit pixels SSPX1 to SSPX3 around the light emitting unit LSU (see FIGS. 9 to 12) (or light-emitting-element layer) included in the unit pixels SSPX1 to SSPX3. Because the first to third unit pixels SSPX1 to SSPX3 are substantially equal to each other, the light emitting unit LSU will be described based on the first unit pixel SSPX1.

Referring to FIG. 13, the first unit pixel SSPX1 may include a first electrode ETL1 and second electrodes ETL21, ETL22, and ETL23 that are spaced apart from each other, and at least one light emitting element LD coupled between the first and second electrodes ETL1, ETL21, ETL22, and ETL23

According to an embodiment, the light emitting elements LD included in the same unit pixel SSPX1 to SSPX3 may emit light of the same (e.g., substantially the same) color. According to an embodiment, the first to third unit pixels SSPX1 to SSPX3 may define a light emitting area that emits light of different colors. For instance, the first unit pixel SSPX1 may include light emitting elements LD that emit red light, the second unit pixel SSPX2 may include light emitting elements LD that emit green light, and the third unit pixel SSPX3 may include light emitting elements LD that emit blue light. According to an embodiment, all of the first to third unit pixels SSPX1 to SSPX3 may include light emitting elements LD that emits blue light. In this case, in order to form a full-color pixel PXL, a light conversion layer to convert the color of light emitted from the corresponding unit pixel and/or a color filter may be on at least some of the first to third unit pixels SSPX1 to SSPX3.

According to an embodiment, the first electrode ETL1 may be an electrode shared by the first to third unit pixels SSPX1 to SSPX3. In this case, the first to third unit pixels may be in the first direction DR1.

The second electrodes ETL21, ETL22, and ETL23 may be spaced apart from one side of the first electrode in the second direction DR2. The second electrodes ETL21, ETL22, and ETL23 in the first to third unit pixels SSPX1 to SSPX3 may be arranged in the first direction DR1.

The first and second electrodes ETL1, ETL21, ETL22, and ETL23 may be arranged side by side (in parallel, for example, substantially parallel to each other) to be spaced apart by a set or predetermined interval.

According to an embodiment, the first electrode ETL1 may be a cathode electrode that is electrically coupled to the second power supply VSS. The second electrodes ETL21, ETL22, and ETL23 may be an anode electrode that is electrically coupled to the first power supply VDD. Each of the second electrodes ETL21, ETL22, and ETL23 may include a contact hole CH. The light emitting elements LD that are electrically coupled at first and second ends to the first electrode ETL1 and the second electrodes ETL21, ETL22, and ETL23 are located, so that the first electrode ETL1 and each of the second electrodes ETL21, ETL22, and ETL23 may be electrically coupled to each other.

According to an embodiment, one light emitting area for one unit pixel (e.g. SSPX1) may be defined. The light emitting area may be distinguished by the non-light-emitting area. In some embodiments, a pixel defining layer (or bank, light shielding pattern) for preventing or reducing transmission of light emitted from the light emitting element LD to another area may be in the non-light-emitting area to overlap therewith. Herein, the term "overlap" means that two components overlap each other in the thickness direction (in the drawing, direction (e.g. third direction DR3) perpendicular (e.g., substantially perpendicular) to the surface of the base layer SUB1) of the display panel, unless otherwise defined.

Figure 14:
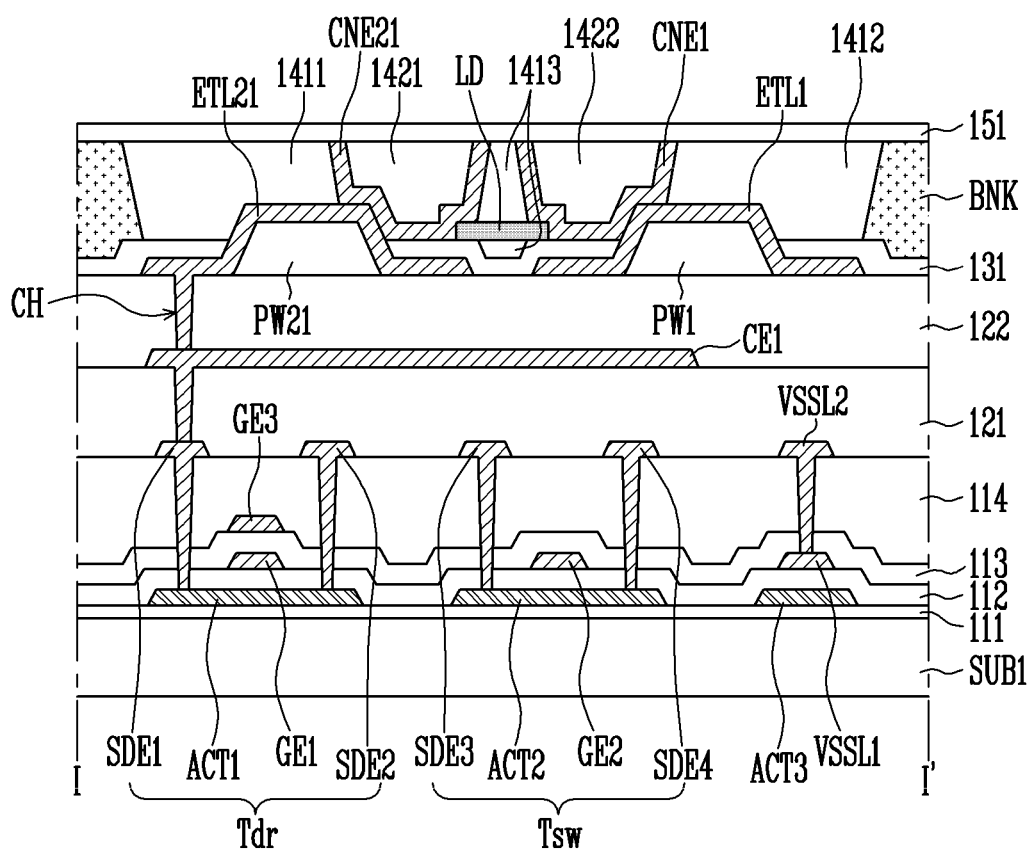
FIG. 14 is a cross-sectional view of the display panel taken along line I-I' of FIG. 13.

FIG. 14 is a cross-sectional view of the display panel taken along line I-I' of FIG. 13.

Referring to FIG. 14, the display panel may include the base layer SUB1 located at a lower position. Because the base layer SUB1 has been described above, duplicative description thereof will not be repeated here.

A first buffer layer 111 is on the base layer SUB1. The first buffer layer 111 functions to make the surface of the base layer SUB1 smooth and to prevent or reduce penetration of water or external air. The first buffer layer 111 may be an inorganic layer. The first buffer layer 111 may be a single-layer structure or a multi-layer structure.

A plurality of transistors Tdr and Tsw is on the first buffer layer 111. Here, each of the transistors Tdr and Tsw may be a thin film transistor. Two transistors Tdr and Tsw shown in the drawing correspond to a driving transistor and a switch transistor, respectively.

Each of the transistors Tdr and Tsw may include a semiconductor pattern ACT1, ACT2, a gate electrode GE1, GE2, a source electrode SDE2, SDE4, and a drain electrode SDE1, SDE3. For example, the first transistor Tdr that is a driving transistor may include a first semiconductor pattern ACT1, a first gate electrode GE1, a first source electrode SDE2, and a first drain electrode SDE1. The second transistor Tsw that is a switch transistor may include a second semiconductor pattern ACT2, a second gate electrode GE2, a second source electrode SDE4, and a second drain electrode SDE3.

In some embodiments, a semiconductor layer is on the first buffer layer 111. The semiconductor layer may include a first semiconductor pattern ACT1 and a second semiconductor pattern ACT2. The semiconductor layer may further include a third semiconductor pattern ACT3.

The semiconductor layer may include amorphous silicon, poly silicon, low temperature poly silicon, and an organic semiconductor. In an embodiment, the semiconductor layer may be an oxide semiconductor. In some embodiments, the semiconductor layer may include a channel area, and a source area and a drain area which are on both sides of the channel area and doped with impurities.

A first gate insulating layer 112 is on the semiconductor layer. The first gate insulating layer 112 may be an inorganic layer. The first gate insulating layer 112 may be a single-layer structure or a multi-layer structure.

A first conductive layer is on the first gate insulating layer 112. The first conductive layer may include the first gate electrode GE1 and the second gate electrode GE2 that are described above. The first conductive layer may further include a first low power pattern VSSL1. The first conductive layer may be formed of metal material having conductivity. For example, the first conductive layer may include molybdenum (Mo), aluminum (Al), copper (Cu), and/or titanium (Ti). The first conductive layer may be a single-layer structure or a multi-layer structure.

A first low power pattern VSSL1 may be electrically coupled to the second power supply line. The first low power pattern VSSL1 may be in the display area DA, and may overlap with the third semiconductor pattern ACT3.

A second gate insulating layer 113 is on the first conductive layer. The second gate insulating layer 113 may be an inorganic layer. The second gate insulating layer 113 may be a single-layer structure or a multi-layer structure.

A second conductive layer is on the second gate insulating layer 113. The second conductive layer may include a third gate electrode GE3. The third gate electrode GE3 may be a gate electrode of another transistor, but the present disclosure is not limited thereto. The second conductive layer may be formed of metal material having conductivity. For example, the second conductive layer may include molybdenum (Mo), aluminum (Al), copper (Cu), and/or titanium (Ti). The second conductive layer may be a single-layer structure or a multi-layer structure.

An interlayer insulating layer 114 is on the second conductive layer. The interlayer insulating layer 114 may be an organic layer or an inorganic layer. The interlayer insulating layer 114 may have a single-layer structure or a multi-layer structure.

A third conductive layer is on the interlayer insulating layer 114. The third conductive layer may include source electrodes SDE2 and SDE4 and drain electrodes SDE1 and SDE3 that are described above. The third conductive layer may further include a second low power pattern VSSL2. The third conductive layer may be formed of metal material having conductivity (e.g., electrical conductivity). For example, the source electrodes SDE2 and SDE4, the drain electrodes SDE1 and SDE3, and the second low power pattern VSSL2 may include aluminum (Al), copper (Cu), titanium (Ti), and/or molybdenum (Mo).

The second low power pattern VSSL2 may be electrically coupled to the second power supply line. The second low power pattern VSSL2 may contact the first low power pattern VSSL1 through contact holes formed through the second gate insulating layer 113 and the interlayer insulating layer 114. The second low power pattern VSSL2 may be in the display area DA, and may overlap with the first low power pattern VSSL1 and the third semiconductor pattern ACT3.

The source electrodes SDE2 and SDE4 and the drain electrodes SDE1 and SDE3 are not limited to names. In an embodiment, the source electrodes SDE2 and SDE4 illustrated in FIG. 14 may perform the function of the drain electrode, and the drain electrodes SDE1 and SDE3 illustrated in FIG. 14 may perform the function of the source electrode.

The source electrodes SDE2 and SDE4 and the drain electrodes SDE1 and SDE3 may be electrically coupled to the source area and the drain area of each of the corresponding semiconductor patterns ACT1 and ACT2 through contact holes formed through the interlayer insulating layer 114, the second gate insulating layer 113, and the first gate insulating layer 112.

In some embodiments, the display panel may further include a storage capacitor on the base layer SUB1.

A first protective layer 121 is on the third conductive layer. Here, the first protective layer 121 is located to cover a circuit including the transistors Tdr and Tsw. The first protective layer 121 may be in at least a portion of the non-display area NDA. The first protective layer 121 may be a passivation layer or a planarization layer. The passivation layer may include SiO2, SiNx, and/or the like, and the planarization layer may include a material such as acryl and polyimide. The first protective layer 121 may include both the passivation layer or the planarization layer. In this case, the passivation layer may be on the third conductive layer and the interlayer insulating layer 114, and the planarization layer may be on the passivation layer. The upper surface of the first protective layer 121 may be planarized.

A fourth conductive layer may be on the first protective layer 121. The fourth conductive layer may include several conductive patterns such as a power supply line, a signal line, and a connection electrode. In the drawings, the fourth conductive layer includes a first connection pattern CE1 in the display area DA. The fourth conductive layer may be formed of metal material having conductivity (e.g., electrical conductivity). For example, the fourth conductive layer may include aluminum (Al), copper (Cu), titanium (Ti), and/or molybdenum (Mo).

The first connection pattern CE1 may contact any one of the source electrode SDE2 and the drain electrode SDE1 of the first transistor Tdr through one contact hole formed through the first protective layer 121.

A second protective layer 122 is on the fourth conductive layer. The second protective layer 122 may be a passivation layer or a planarization layer. The passivation layer may include SiO2, SiNx, and/or the like, and the planarization layer may include a material such as acryl and polyimide. The second protective layer 122 may include the passivation layer and/or the planarization layer.

In some embodiments, the second protective layer 122 may include an opening to expose upper portions of some members of the fourth conductive layer included in the fourth conductive layer. For example, the second protective layer 122 may include an opening to expose at least a portion of the first connection pattern CE1.

Herein, the base layer SUB1 and the second protective layer 122 are referred to as a pixel circuit layer.

The display panel may include first and second partition walls PW1 and PW21, first and second electrodes ETL1 and ETL21, an insulating layer 131, a bank BNK, light emitting elements LD, a first organic layer 141, first and second contact electrodes CNE1 and CNE21, a second organic layer 142, and a thin-film encapsulation layer 151, which are sequentially on the second protective layer 122 with respect to the display area DA.

Although it is illustrated in the drawing that the above-described elements are directly and sequentially on the second protective layer 122, some elements may be omitted or other elements may be further between the elements.

The first and second partition walls PW1 and PW21 may be on a pixel circuit layer (e.g., second protective layer 122). The first and second partition walls PW1 and PW21 may protrude from the pixel circuit layer in the thickness direction (e.g. third direction DR3). In an embodiment, the first and second partition walls PW1 and PW21 may have substantially the same (e.g., substantially the same) height, but the present disclosure is not limited thereto. For example, the protruding height of each of the first and second partition walls PW1 and PW21 may be in a range from about 1.0 µm to 1.5 µm.

In an embodiment, the first partition wall PW1 may be between the pixel circuit layer and the first electrode ETL1. The second partition wall PW21 may be between the pixel circuit layer and the second electrode ETL21, ETL22, and ETL23 (where second electrodes ETL22 and ETL23 are shown in FIG. 13).

In an embodiment, each of the first and second partition walls PW1 and PW21 may have various suitable shapes. By way of example, as illustrated in the drawings, each of the first and second partition walls PW1 and PW21 may have the cross-sectional shape of a trapezoid that is reduced in width from a bottom to a top thereof. In this case, each of the first and second partition walls PW1 and PW21 may have an inclined surface on at least one side.

As another example, each of the first and second partition walls PW1 and PW21 may have the cross-section of a semi-circle or a semi-ellipse that is reduced in width from a bottom to a top thereof. In this case, each of the first and second partition walls PW1 and PW21 may have a curved surface on at least one side. In other words, the shape of each of the first and second partition walls PW1 and PW21 may be changed in various suitable ways rather than being particularly limited. In an embodiment, at least one of the first and second partition walls PW1 and PW21 may be omitted or changed in position.

Each of the first and second partition walls PW1 and PW21 may include an insulating material including an inorganic material or an organic material. By way of example, the first and second partition walls PW1 and PW21 may include at least one inorganic layer including various suitable inorganic insulating materials generally used in the art, such as SiNx and/or SiOx. In some embodiments, the first and second partition walls PW1 and PW21 may include at least one organic layer and/or photoresist layer containing various suitable organic insulating materials, or may form a single- or multi-layer insulator containing organic/inorganic materials in combination. In other words, the materials of the first and second partition walls PW1 and PW2 may be variously changed.

In an embodiment, each of the first and second partition walls PW1 and PW21 may function as a reflective member. For example, the first and second partition walls PW1 and PW21, along with the first and second electrodes ETL1 and ETL21 provided on the first and second partition walls PW1 and PW21, may function as reflective members that guide light emitted from each light emitting element LD in a desired direction, thus enhancing the light efficiency of the pixel PXL.

The first and second electrodes ETL1 and ETL21 may be on the first and second partition walls PW1 and PW21, respectively. The first and second electrodes ETL1 and ETL21 may be spaced apart from each other. The first and second electrodes ETL1 and ETL21 may be formed on the same layer (e.g., on the same level).

In an embodiment, the first and second electrodes ETL1 and ETL21 on the upper portions of the first and second partition walls PW1 and PW21, respectively, may have shapes corresponding to the respective shapes of the first and second partition walls PW1 and PW21. For example, the first and second electrodes ETL1 and ETL21 may each protrude in the thickness direction of the display panel while having inclined surfaces or curved surfaces corresponding to the first and second partition walls PW1 and PW21, respectively.

Each of the first and second electrodes ETL1 and ETL21 may include at least one conductive material. For example, each of the first and second electrodes ETL1 and ETL21 may include at least one of metal such as Ag, Mg, Al, Pt, Pd, Au, Ni, Nd, Ir, Cr, Ti, and/or an alloy thereof, a conductive oxide such as ITO, IZO, ZnO, and/or ITZO, and/or a conductive polymer such as PEDOT; however, it is not limited thereto.

Furthermore, each of the first and second electrodes ETL1 and ETL21 may have a single-layer structure or a multi-layer structure. By way of example, each of the first and second electrodes ETL1 and ETL21 may include at least one reflective electrode layer. Each of the first and second electrodes ETL1 and ETL21 may selectively further include at least one of at least one transparent electrode layer on an upper portion and/or a lower portion of the reflective electrode layer, and at least one conductive capping layer covering an upper portion of the reflective electrode layer and/or the transparent electrode layer.

According to an embodiment, the reflective electrode layer of each of the first and second electrodes ETL1 and ETL21 may be formed of an electrode material having uniform (e.g., substantially uniform) reflectivity. For example, the reflective electrode layer may include at least one of metals such as Ag, Mg, Al, Pt, Pd, Au, Ni, Nd, Ir, Cr, and/or an alloy thereof; however, the present disclosure is not limited thereto. In other words, the reflective electrode layer may be formed of various suitable reflective electrode materials. When each of the first and second electrodes ETL1 and ETL21 includes the reflective electrode layer, light emitted from both ends of each of the light emitting elements LD, that is, first and second ends may be further advanced in a direction (e.g. third direction DR3, front direction) in which an image is displayed. For example, if the first and second electrodes ETL1 and ETL21 are located to face the first and second ends of the light emitting elements LD while having inclined surfaces or curved surfaces corresponding to the shape of the first and second partition walls PW1 and PW21, the light emitted from the first and second ends of each of the light emitting elements LD may be reflected by the first and second electrodes ETL1 and ETL21 and then may be further advanced in the front direction (e.g. the third direction DR3 that is the upper direction of the base layer SUB1) of the display panel. Consequently, the efficiency of light emitted from the light emitting elements LD may be enhanced.

Furthermore, the transparent electrode layer of each of the first and second electrodes ETL1 and ETL21 may be formed of various suitable transparent electrode materials. By way of example, the transparent electrode layer may include ITO, IZO, and/or ITZO, but the present disclosure is not limited thereto. In an embodiment, each of the first and second electrodes ETL1 and ETL21 may have a three-layer structure having a stacked structure of ITO/Ag/ITO. As such, if the first and second electrodes ETL1 and ETL21 each are composed of a multi-layer structure of at least two or more layers, voltage drop due to signal delay (RC delay) may be minimized or reduced. Thus, a suitable or desired voltage can be effectively transmitted to the light emitting elements LD.

In addition, if each of the first and second electrodes ETL1 and ETL21 includes the conductive capping layer covering the reflective electrode layer and/or the transparent electrode layer, it is possible to prevent or reduce damage to the reflective electrode layer of the first and second electrodes ETL1 and ETL21 due to defects caused during the manufacturing process of the pixel PXL. However, the conductive capping layer may be selectively included in the first and second electrodes ETL1 and ETL21, and may be omitted according to an embodiment. Furthermore, the conductive capping layer may be considered as a component of each of the first and second electrodes ETL1 and ETL21, or considered as a separate component on the first and second electrodes ETL1 and ETL21.

In an embodiment, at least some areas of the second electrodes ETL21, ETL22, and ETL23 (where second electrodes ETL22 and ETL23 are shown in FIG. 13) may overlap the first connection pattern CE1. The second electrodes ETL21, ETL22, and ETL23 may contact the first connection pattern CE1 through the first contact holes CH formed through the second protective layer 122.

The insulating layer 131 may be in one area of each of the first and second electrodes ETL1 and ETL21 in the display area DA. For example, the insulating layer 131 may form to cover one area of each of the first and second electrodes ETL1 and ETL21, and may include an opening CH to expose another area of each of the first and second electrodes ETL1 and ETL21.

In some embodiments, the insulating layer 131 may be interposed between the first and second electrodes ETL1 and ETL21 and the light emitting elements LD, and may expose at least one area of each of the first and second electrodes ETL1 and ETL21. After the first and second electrodes ETL1 and ETL21 are formed, the insulating layer 131 is formed to cover the first and second electrodes ETL1 and ETL21, so that it is possible to prevent or reduce damage to the first and second electrodes ETL1 and ETL21 or to prevent or reduce precipitation of metal in a subsequent process. Furthermore, the insulating layer 131 may stably support each light emitting element LD. In an embodiment, the insulating layer 131 may be omitted.

The light emitting elements LD may be supplied and aligned, on the area in which the insulating area 131 is located, between the first and second electrodes ETL1 and ETL21. By way of example, the light emitting elements LD may be supplied through an inkjet method and/or the like, and the light emitting elements LD may be aligned between the first and second electrodes ETL1 and ETL21 by a set or predetermined alignment voltage (or alignment signal) applied to the first and second electrodes ETL1 and ETL21.

In an embodiment, the thickness of the insulating layer 131 may be in a range from about 2500 Å to 3500 Å.

The bank BNK may be on the insulating layer 131. By way of example, the bank BNK may be formed, to enclose the sub-pixels (SPX1 to SPX3 of FIG. 8), between other sub-pixels, thus forming a pixel defining layer to partition the light emitting area. The height of the bank BNK may be higher than the height of the partition walls PW1 and PW2.

In some embodiments, the bank BNK may not be between the unit pixels SSPX1 to SSPXk in the same sub-pixels SPX1 to SPX3, but the present disclosure is not limited thereto.

The first organic layer 141 may be on the insulating layer 131, the first and second electrodes ETL1 and ETL2, and the light emitting elements LD.

In an embodiment, the first organic layer 141 may include organic material. For example, the organic material may include material such as polyimide resin, acrylic resin, silicon compound, and/or polyacrylic resin.

In an embodiment, the first organic layer 141 may include a first organic pattern 1411 that is in direct contact with the second electrode ETL21, a second organic pattern 1412 that is in direct contact with the first electrode ETL1, and a third organic pattern 1413 that is in direct contact with the light emitting elements LD. The third organic pattern 1413 may be between the first organic pattern 1411 and the second organic pattern 1412, and each of the first and second organic patterns 1411 and 1412 may be between the bank BNK and the third organic pattern 1413.

The third organic pattern 1413 may be directly on the light emitting elements LD aligned between the first and second electrodes ETL1 and ETL2, and may expose the first and second ends of the light emitting elements LD. For example, the third organic pattern 1413 may be partially only on one area of each of the light emitting elements LD, without covering the first ends and second ends of the light emitting elements LD. The third organic pattern 1413 may be formed in an independent pattern on each light emitting area; however, the present disclosure is not limited thereto. Furthermore, as illustrated in FIG. 14, if a space is present between the insulating layer 131 and each of the light emitting elements LD before the third organic pattern 1413 is formed, the space may be filled with the third organic pattern 1413. Consequently, the light emitting elements LD may be more stably supported. In other embodiments, the space between the insulating layer 131 and each of the light emitting elements LD may be omitted.

In an embodiment, the first organic pattern 1411 and the third organic pattern 1413 may be spaced apart from each other, and the second organic pattern 1412 and the third organic pattern 1413 may be spaced apart from each other. A space defined between the first organic pattern 1411 and the third organic pattern 1413 may expose at least a portion of the second electrode ETL21 and the first end of the light emitting element LD, and a space defined between the second organic pattern 1412 and the third organic pattern 1413 may expose at least a portion of the first electrode ETL1 and the second end of the light emitting element LD.

The upper surface of the first organic layer 141 may be generally flat. In other words, the first to third organic patterns 1411, 1412, and 1413 may generally have the same (e.g., substantially the same) height. In an embodiment, the bank BNK and the first to third organic patterns 1411, 1412, and 1413 may generally have the same (e.g., substantially the same) height. Thus, the display panel may have a generally flat surface on the bank BNK and the first to third organic patterns 1411, 1412, and 1413.

In an embodiment, the first and second contact electrodes CNE1 and CNE21 may be on the same layer (e.g., on the same level). The first and second contact electrodes CNE1 and CNE21 may be formed along the edge of the space defined by the first to third organic patterns 1411, 1412, and 1413. For example, the first contact electrode CNE1 may be formed along the edge of the space between the second organic pattern 1412 and the third organic pattern 1413. Furthermore, the second contact electrode CNE21 may be located along the edge of the space between the first organic pattern 1411 and the third organic pattern 1413. Thus, each of the first and second contact electrodes CNE1 and CNE21 may define a groove on an upper portion thereof.

The first contact electrode CNE1 may be on the first electrode ETL1 to contact the first electrode ETL1. By way of example, the first contact electrode CNE1 may be located to contact the first electrode ETL1 on one area of the first electrode ETL1 that is not covered by the insulating layer 131 and the second organic pattern 1412. Furthermore, the first contact electrode CNE1 may be on ends of at least two light emitting elements LD adjacent to the first electrode ETL1 to contact the ends of the at least two light emitting elements LD. In other words, the first contact electrode CNE1 may be located to cover the first end or the second end of each of the light emitting elements LD and at least one area of the first electrode ETL1 corresponding thereto. Thereby, the first end or the second end of each of the light emitting elements LD may be electrically coupled to each first electrode ETL1.

The second contact electrode CNE21 may be on the second electrode ETL21 to contact the second electrode ETL21. By way of example, the second contact electrode CNE21 may be located to contact the second electrode ETL21 on one area of the second electrode ETL21 that is not covered by the insulating layer 131 and the first organic pattern 1411. Furthermore, the second contact electrode CNE21 may be on ends of at least two light emitting elements LD adjacent to the second electrode ETL21 to contact the ends of the at least two light emitting elements LD. In other words, the second contact electrode CNE21 may be located to cover the first end or the second end of each of the light emitting elements LD and at least one area of the second electrode ETL21 corresponding thereto. Thereby, the first end or the second end of each of the light emitting elements LD may be electrically coupled to each second electrode ETL21.

In an embodiment, each of the first and second contact electrodes CNE1 and CNE21 may be formed of a transparent conductive material such as ITO, IZO, and/or ITO to allow light emitted from the light emitting elements LD to be transmitted.

In an embodiment, the second organic layer 142 may be on the first and second contact electrodes CNE1 and CNE21 to cover the first and second contact electrodes CNE1 and CNE21.

The second organic layer 142 may include a fourth organic pattern 1421 that is directly on the second contact electrode CNE21, and a fifth organic pattern 1422 that is directly on the first contact electrode CNE1. The fourth organic pattern 1421 and the fifth organic pattern 1422 may fill grooves on the second contact electrode CNE21 and the first contact electrode CNE1, respectively. In an embodiment, the bank BNK, the first to third organic patterns 1411, 1412, and 1413, the first and second contact electrodes CNE1 and CNE21, and the fourth and fifth organic patterns 1421 and 1422 may have the same (e.g., substantially the same) height. Thus, the display panel may have an almost flat surface on the bank BNK, the first to third organic patterns 1411, 1412, and 1413, the first and second contact electrodes CNE1 and CNE21, and the fourth and fifth organic patterns 1421 and 1422.

In an embodiment, the second organic layer 142 may include and organic material. For example, the organic material may include a material such as polyimide resin, acrylic resin, silicon compound, and/or polyacrylic resin.

The display panel may have the thin-film encapsulation layer 151 on the bank BNK, the first to third organic patterns 1411, 1412, and 1413, the first and second contact electrodes CNE1 and CNE21, and the fourth and fifth organic patterns 1421 and 1422 to cover them. The thin-film encapsulation layer 151 may include another insulating layer. In an embodiment, the thin-film encapsulation layer 151 may be a passivation layer. In an embodiment, the thin-film encapsulation layer 151 may be omitted.

Next, the method of manufacturing the above-described display panel will be described with reference to FIGS. 15 to 26. Hereinafter, because each active act of the manufacturing process of the display panel is a portion of the manufacturing method of the display device, the manufacturing method of the display panel will be referred to as the manufacturing method of the display device.

Figure 15:
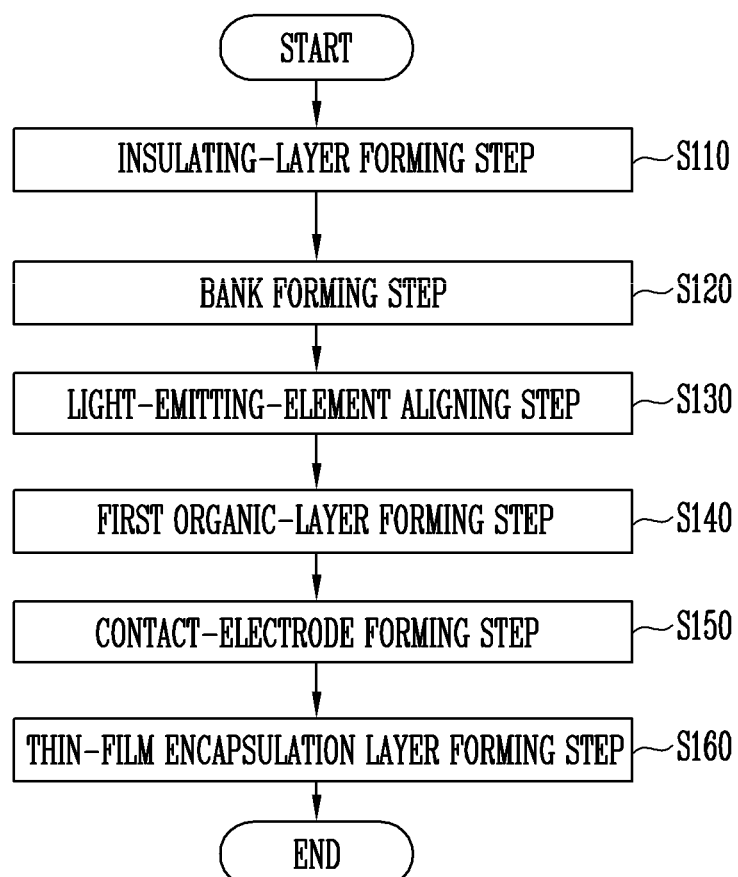
FIG. 15 is a flowchart illustrating a manufacturing method of a display device in accordance with an embodiment of the present disclosure.

FIG. 15 is a flowchart illustrating the manufacturing method of the display device in accordance with an embodiment of the present disclosure. FIGS. 16 to 26 are cross-sectional views illustrating respective processes described in the flowchart of FIG. 15.

Referring to FIG. 15, the manufacturing method of the display device in accordance with an embodiment may include an insulating-layer forming S110, a bank forming S120, a light-emitting-element aligning S130, a first organic-layer forming S140, a contact-electrode forming S150, and a thin-film encapsulation layer forming S160.

Although it is described herein that respective active acts are sequentially performed according to the flowchart, it should be apparent to those of ordinary skill in the art that some active acts illustrated as being successively performed may be concurrently (e.g., simultaneously) performed, the sequence of the active acts may be changed, some active acts may be omitted, or another active act may be further included the respective active acts, unless the spirit of the present disclosure is changed. Furthermore, the manufacturing method of the display device shown in FIG. 15 corresponds to some active acts of manufacturing the display panel. FIGS. 16 to 26 illustrate the process of manufacturing the insulating layer 131 and the thin-film encapsulation layer 151 during the manufacturing process of the display panel.

Figure 16:
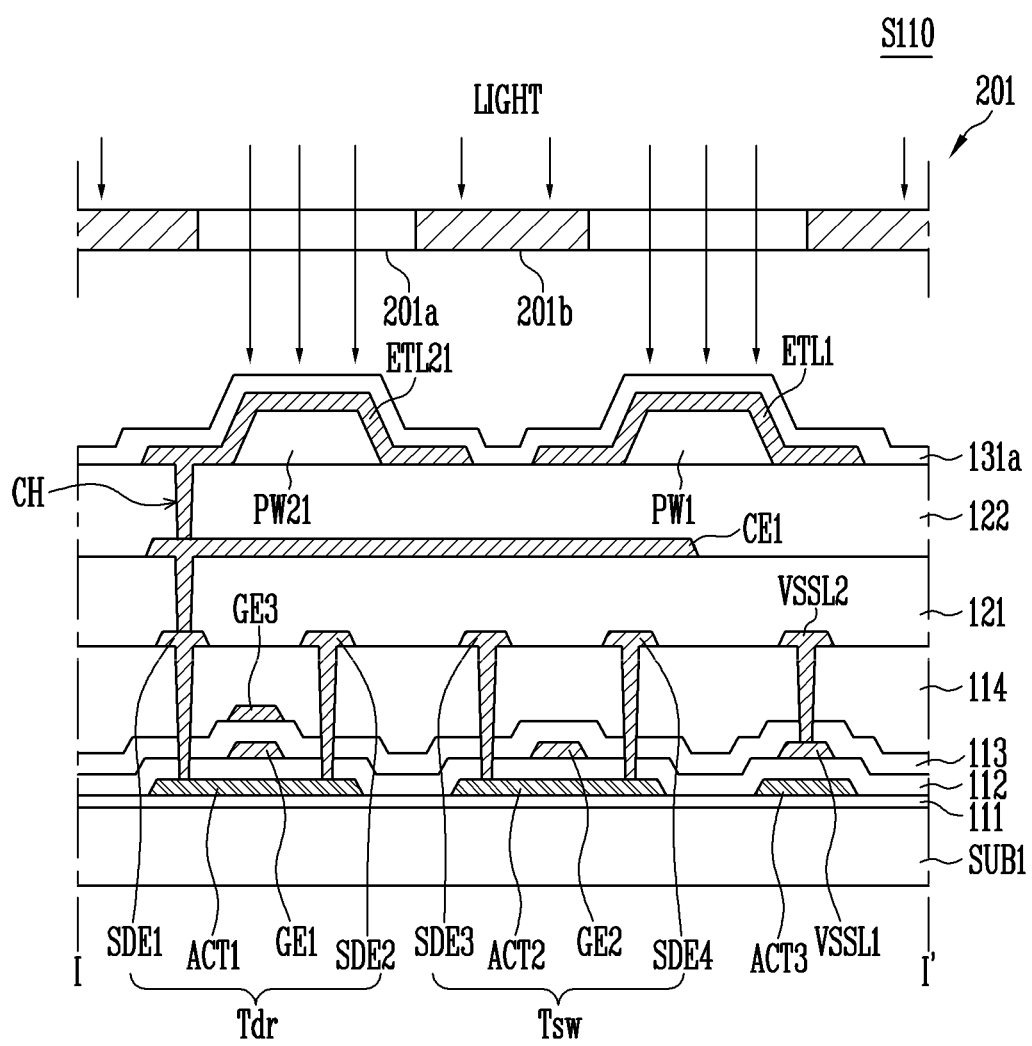
FIGS. 16 to 26 are cross-sectional views illustrating respective processes described in the flowchart of FIG. 15.

First, referring to FIG. 16, the insulating-layer forming S110 may be performed. The insulating-layer forming S110 corresponds to forming the insulating layer 131.

A first insulating material layer 131a is provided throughout an entire surface of the display panel to cover the partition walls PW1 and PW21 and the first and second electrodes ETL1 and ETL21, and a photo resist material is applied to the first insulating material layer 131a.

The first insulating material layer 131a and the photo resist material may be applied by a slit coating method, a spin coating method, and/or a gravure printing method. The photo resist material may be a positive-type photo resist material or a negative-type photo resist material. The photo resist material illustrated in this embodiment includes the positive-type photo resist material, but the present disclosure is not limited thereto. Here, the first insulating material layer 131a contains the material included in the insulating layer 131.

Subsequently, a first mask 201 may be on the first insulating material layer 131a and the photo resist material. The first mask 201 may include a transmission part 201a and a non-transmission part 201b. The non-transmission part 201b corresponds to an area in which the insulating layer 131 is to be formed, and the transmission part 201a corresponds to areas other than the area in which the insulating layer 131 is to be formed (e.g., areas in which the first insulating material layer 131a is to be removed).

Figure 17:
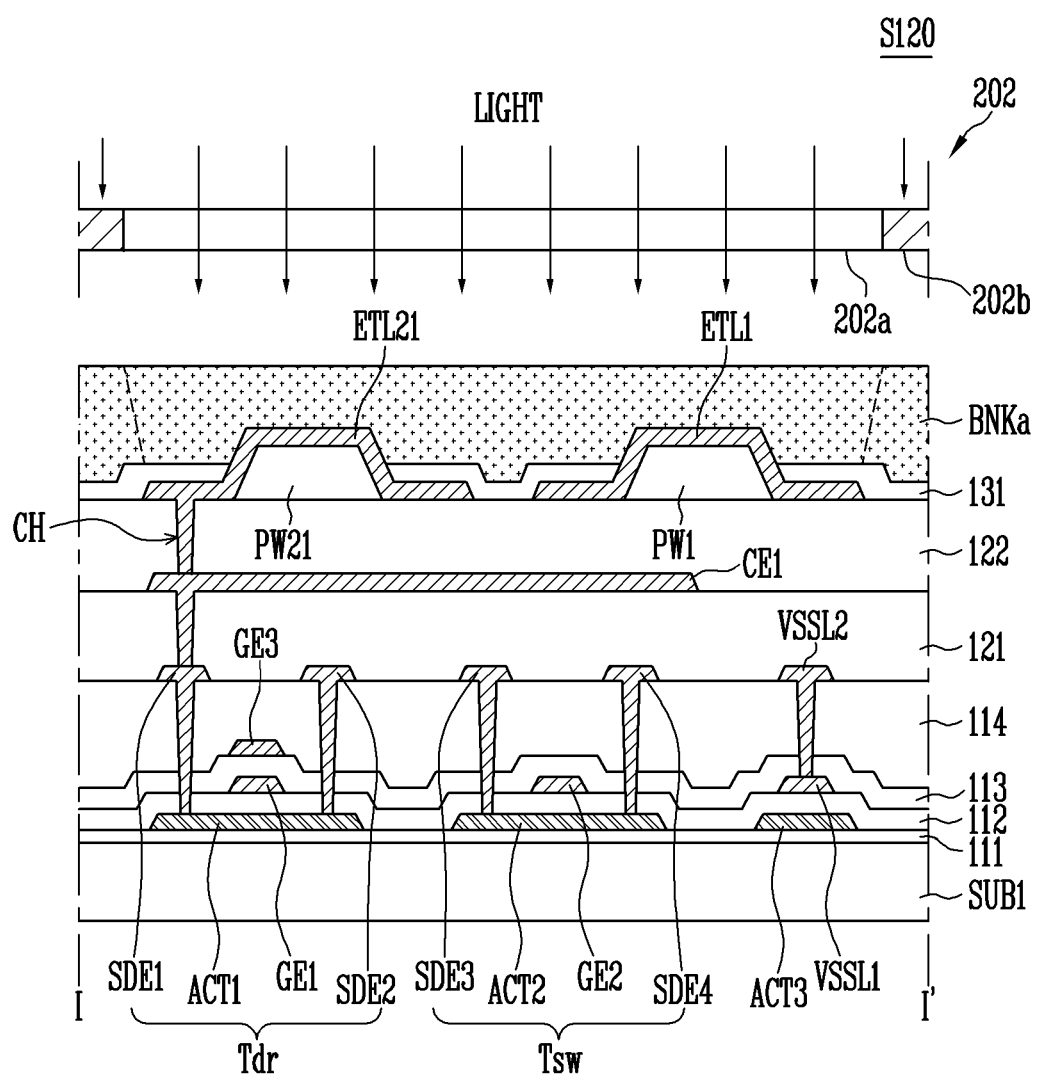

Subsequently, after exposure, development, and etching processes are performed, the insulating layer 131 may be completed as illustrated in FIG. 17.

Next, referring to FIG. 17, the bank forming S120 may be performed. The bank forming S120 corresponds to forming the bank BNK.

A bank material layer BNKa is provided throughout the entire surface of the display panel to cover the partition walls PW1 and PW21, the first and second electrodes ETL1 and ETL21, and the insulating layer 31, and the photo resist material is applied to the bank material layer BNKa. Here, the bank material layer BNKa includes the material contained in the bank BNK.

Subsequently, a second mask 202 may be on the bank material layer BNKa and the photo resist material. The second mask 202 may include a transmission part 202a and a non-transmission part 202b. The non-transmission part 202b corresponds to an area in which the bank BNK is to be formed, and the transmission part 202a corresponds to areas other than the area in which the bank BNK is formed.

Figure 18:
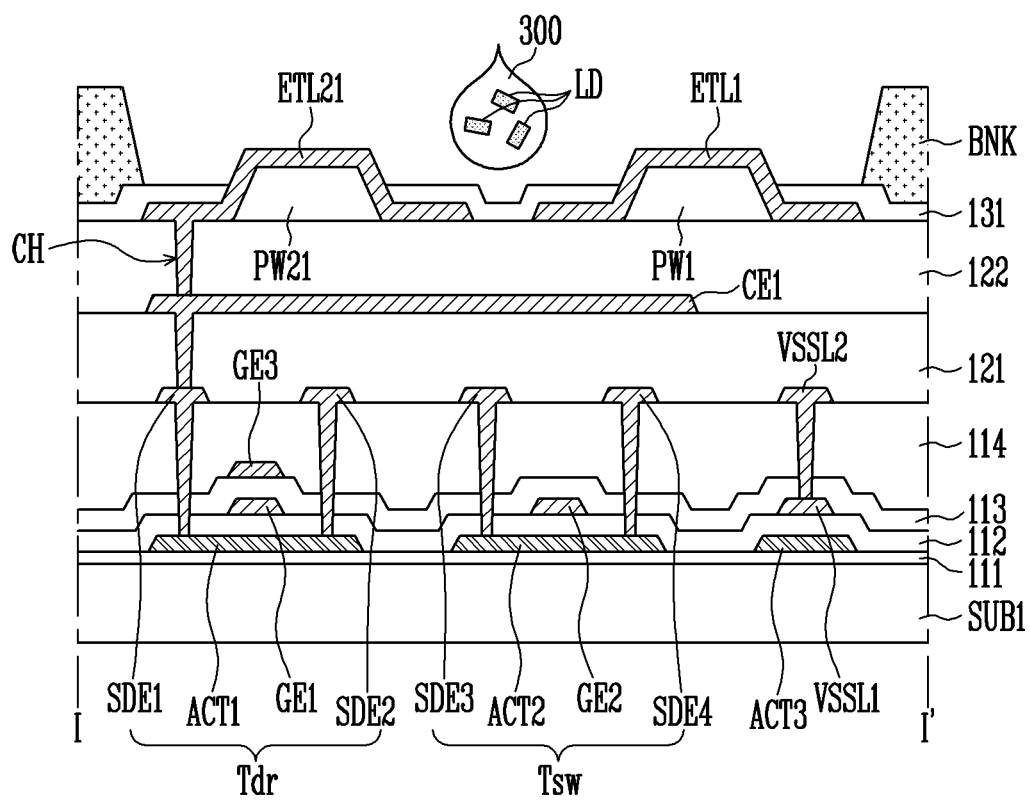

Subsequently, after exposure, development, and etching processes are performed, the bank BNK may be completed as illustrated in FIG. 18.

Next, referring to FIG. 18, the light-emitting-element aligning S130 may be performed. The light-emitting-element aligning S130 corresponds to aligning the light emitting elements LD.

A solution 300 containing at least one light emitting element LD may be provided in an area in which the first and second electrodes ETL1 and ETL21 are formed. As a non-limiting example of the method of putting the light emitting element LD on each of the first and second electrodes ETL1 and ETL21, an inkjet printing method and/or a fine drop process of 50 picoliters (pL) or less corresponding thereto may be used.

For example, in the state where DC or AC voltage is applied to the first and second electrodes ETL1 and ETL21, the solution 300 containing the light emitting element LD may be dropped. The light emitting element LD may be self-aligned between the first electrode ETL1 and the second electrode ETL21.

Figure 19:
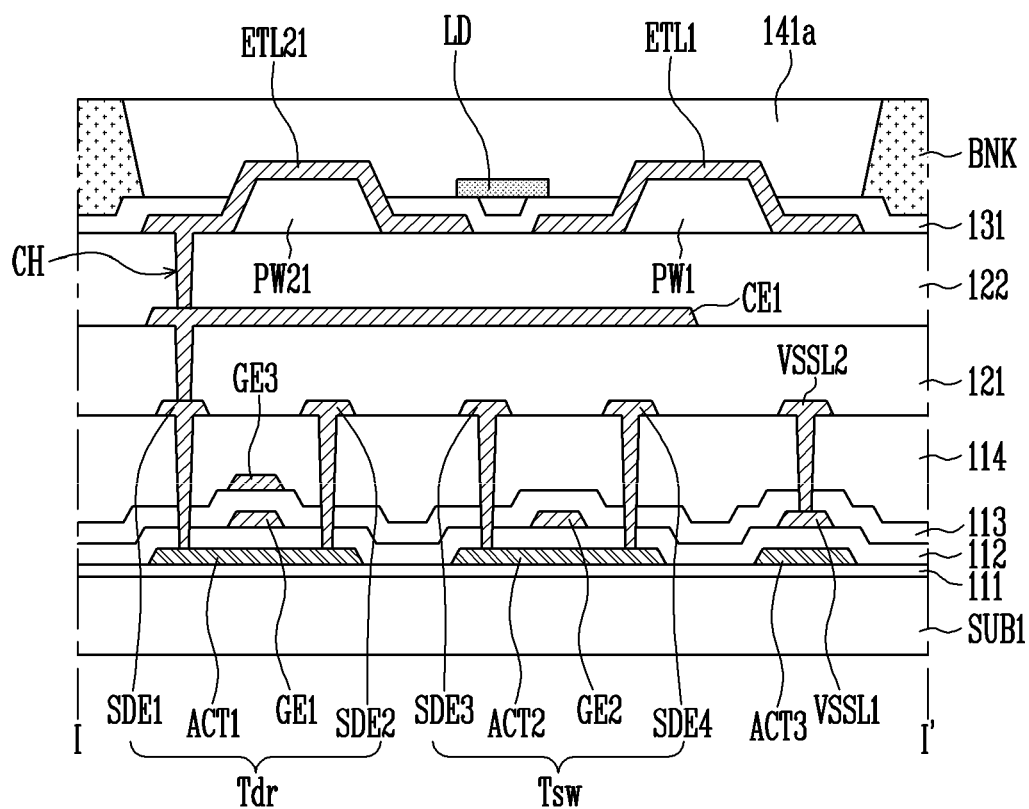

For instance, the self-alignment of the light emitting element LD may be induced by applying the DC or AC voltage to the first and second electrodes ETL1 and ETL21. In some embodiments, if voltage is applied to the first and second electrodes ETL1 and ETL21, bipolarity is induced in the light emitting element LD by an electric field generated between the first electrode ETL1 and the second electrode ETL21. Thus, as illustrated in FIG. 19, the light emitting element LD is self-aligned between the first electrode ETL1 and the second electrode ETL21.

In some embodiments, in contrast to the active acts of FIGS. 16 to 18, according to an embodiment, after the light emitting elements LD are supplied and aligned on the first insulating material layer 131a, the first insulating material layer 131a may be partially opened to expose the first and second electrodes ETL1 and ETL21. For example, the operations described above may be performed in an order different from the one described herein.

Referring to FIGS. 19 to 23, the first organic-layer forming S140 may be performed. The first organic-layer forming S140 corresponds to forming the first organic layer 141.

The first organic-layer forming S140 may include a plurality of sub-active acts. For example, the first organic-layer forming S140 may include a first organic-material-layer forming S141, a first photo-resist-material forming S142, an exposure S143, an etching S144, and/or a development S145. The first organic-material-layer forming S141, the first photo-resist-material forming S142, the exposure S143, the etching S144, and the development S145 correspond to FIGS. 19 to 23, respectively.

First, as shown in FIG. 19, at the first organic-material-layer forming S141, the first organic material layer 141a may be provided throughout the entire surface of the display panel to cover the insulating layer 131, the first and second electrodes ETL1 and ETL21, and the light emitting element LD. Here, the first organic material layer 141a contains the material included in the first organic layer 141.

In an embodiment, the first organic material layer 141a may be applied to a portion between the banks BNK. However, without being limited thereto, in an embodiment, the first organic material layer 141a may be applied to cover the bank BNK, the insulating layer 131, the first and second electrodes ETL1 and ETL21, and the light emitting element LD.

Figure 20:
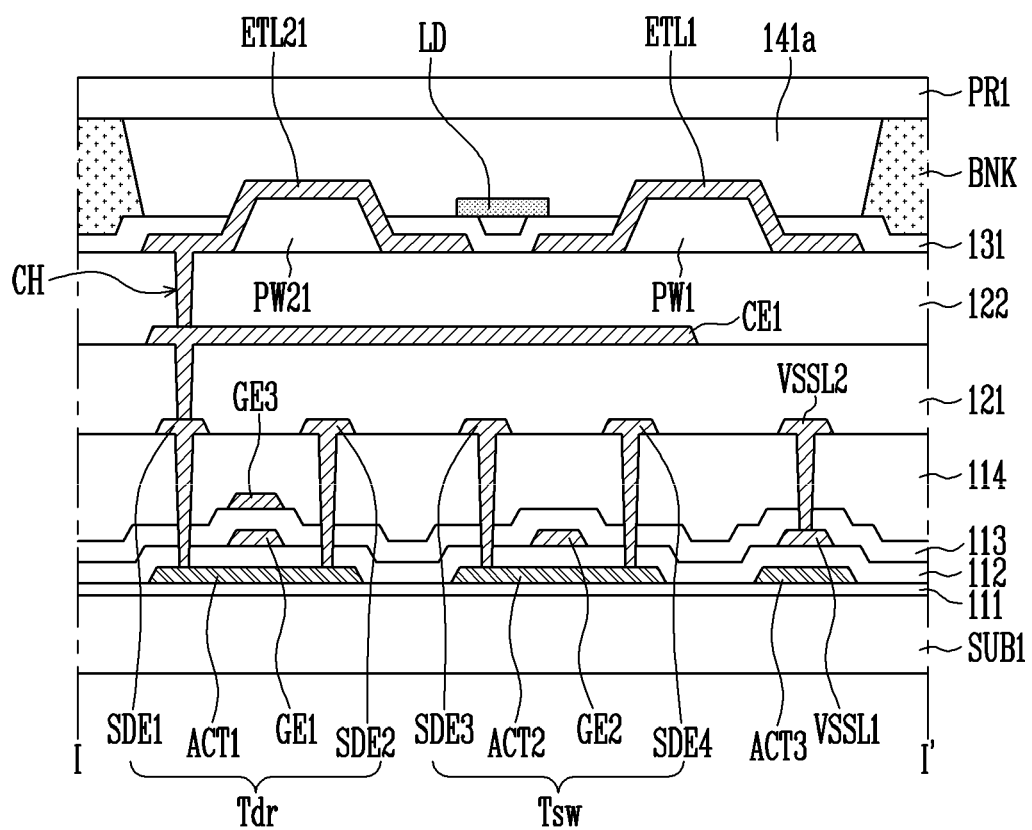

Subsequently, as shown in FIG. 20, at the first photo-resist-material forming S142 and the exposure S143, the first photo resist material PR1 is applied to the first organic material layer 141a. For example, the first photo resist material PR1 may be applied by a slit coating method, a spin coating method, and/or a gravure printing method. The first photo resist material PR1 may be the positive-type photo resist material, but the present disclosure is not limited thereto.

Figure 21:
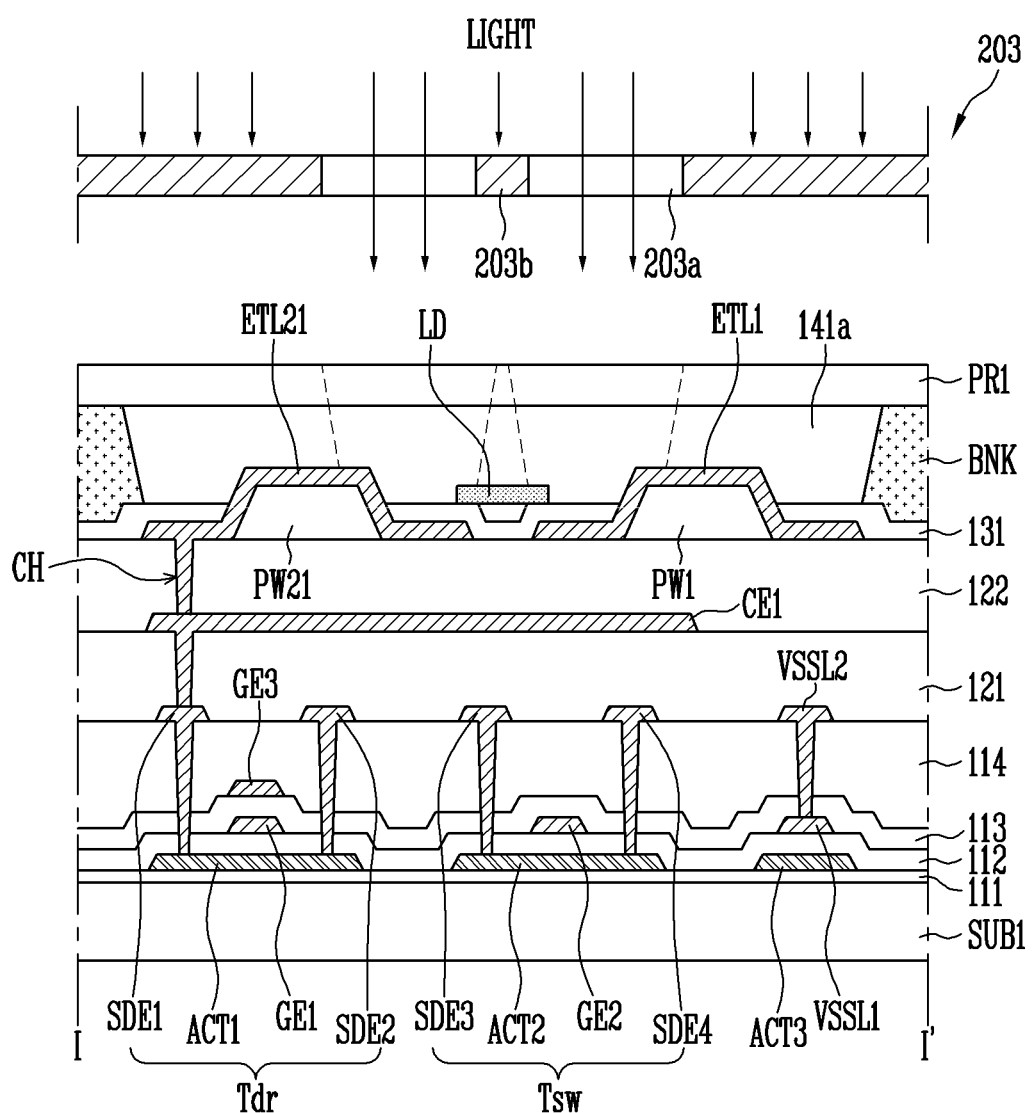

Subsequently, as shown in FIG. 21, a third mask 203 may be on the first organic material layer 141a and the first photo resist material PR1. The third mask 203 may include a transmission part 203a and a non-transmission part 203b. The non-transmission part 203b corresponds to an area in which the first to third organic patterns 1411, 1412, and 1413 are to be formed, and the transmission part 203a corresponds to areas other than an area in which the first to third organic patterns 1411, 1412, and 1413 are formed (e.g., areas where the first organic material layer 141a is to be removed). The areas other than the area in which the first to third organic patterns 1411, 1412, and 1413 are formed may be the area in which the first and second contact electrodes CNE1 and CNE21 are formed.

Light (e.g., UV or laser light) may be emitted on the third mask 203 towards the display panel. The drawing illustrates that light is emitted. The light may pass through the transmission part 203a of the third mask 203 and may not pass through the non-transmission part 203b. The light may pass through the transmission part 203a and then may be irradiated onto a corresponding area on the first photo resist material PR1.

Figure 22:
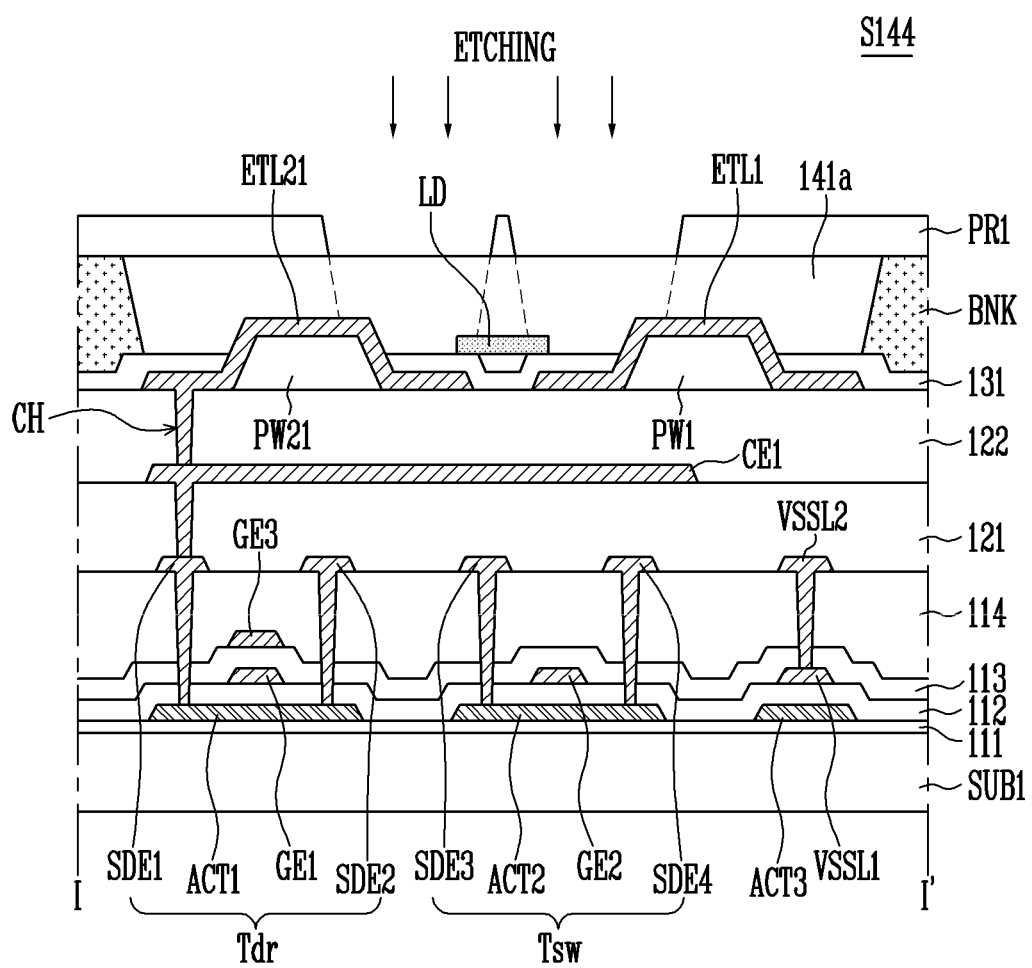
Figure 23:
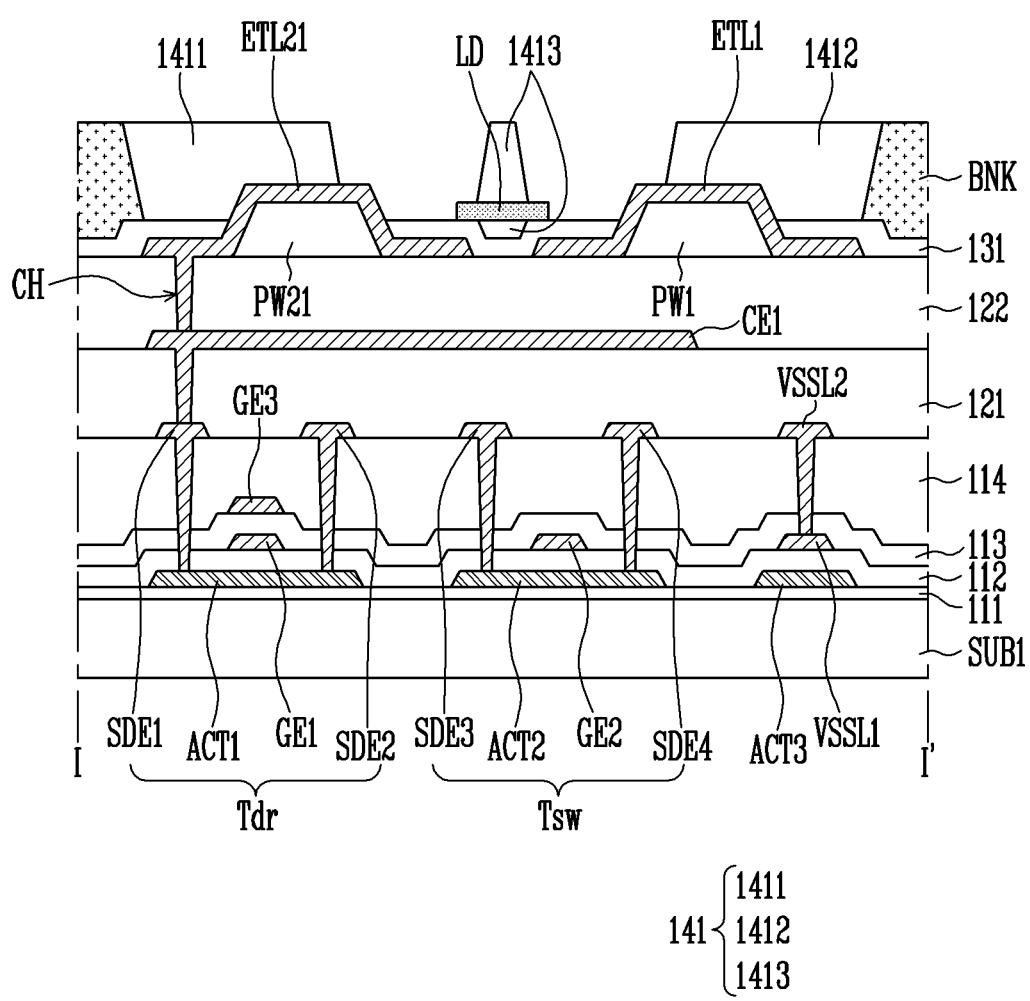

Subsequently, as shown in FIGS. 22 and 23, at the etching S144 and the development S145, the first organic material layer 141a may be divided into the first to third organic patterns 1411, 1412, and 1413 by etchant. Furthermore, the first photo resist material PR1 may be removed by the development or a strip.

After the etching S144 and the development S145 are performed, the first to third organic patterns 1411, 1412, and 1413 may be formed, the second electrode ETL21, the insulating layer 131, and the first end of the light emitting element LD may be exposed between the first organic pattern 1411 and the third organic pattern 1413, and the first electrode ETL1, the insulating layer 131, and the second end of the light emitting element LD may be exposed between the second organic pattern 1412 and the third organic pattern 1413.

Figure 24:
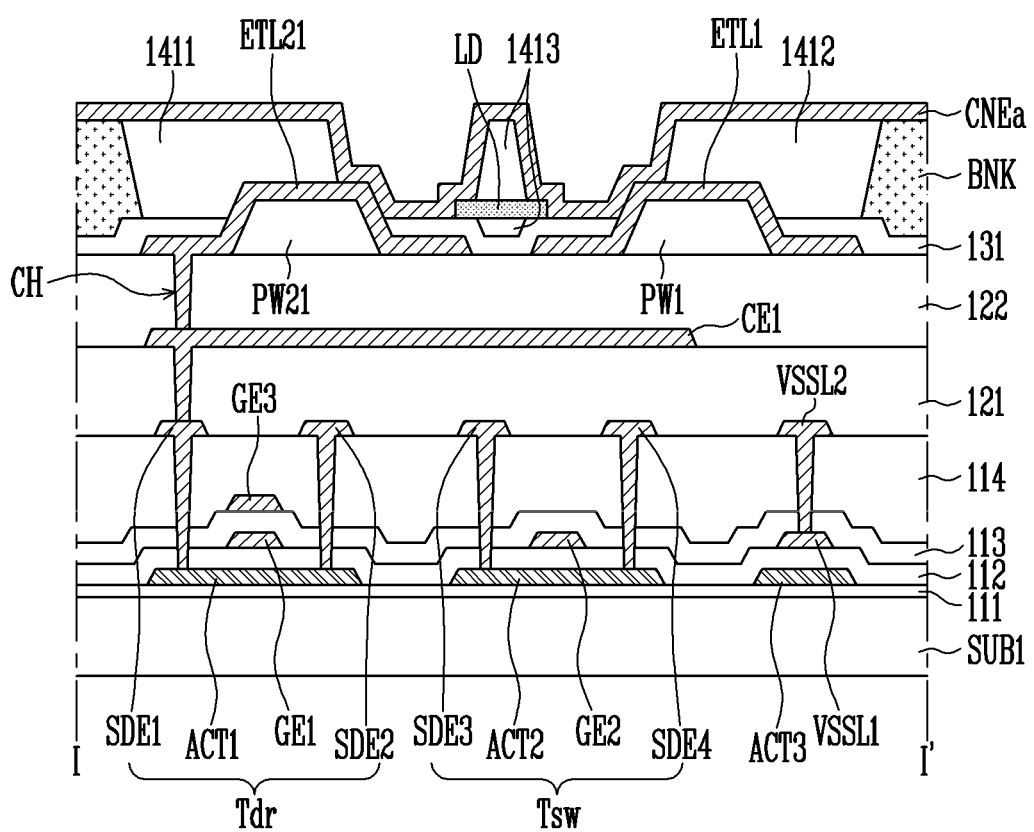
Figure 25:
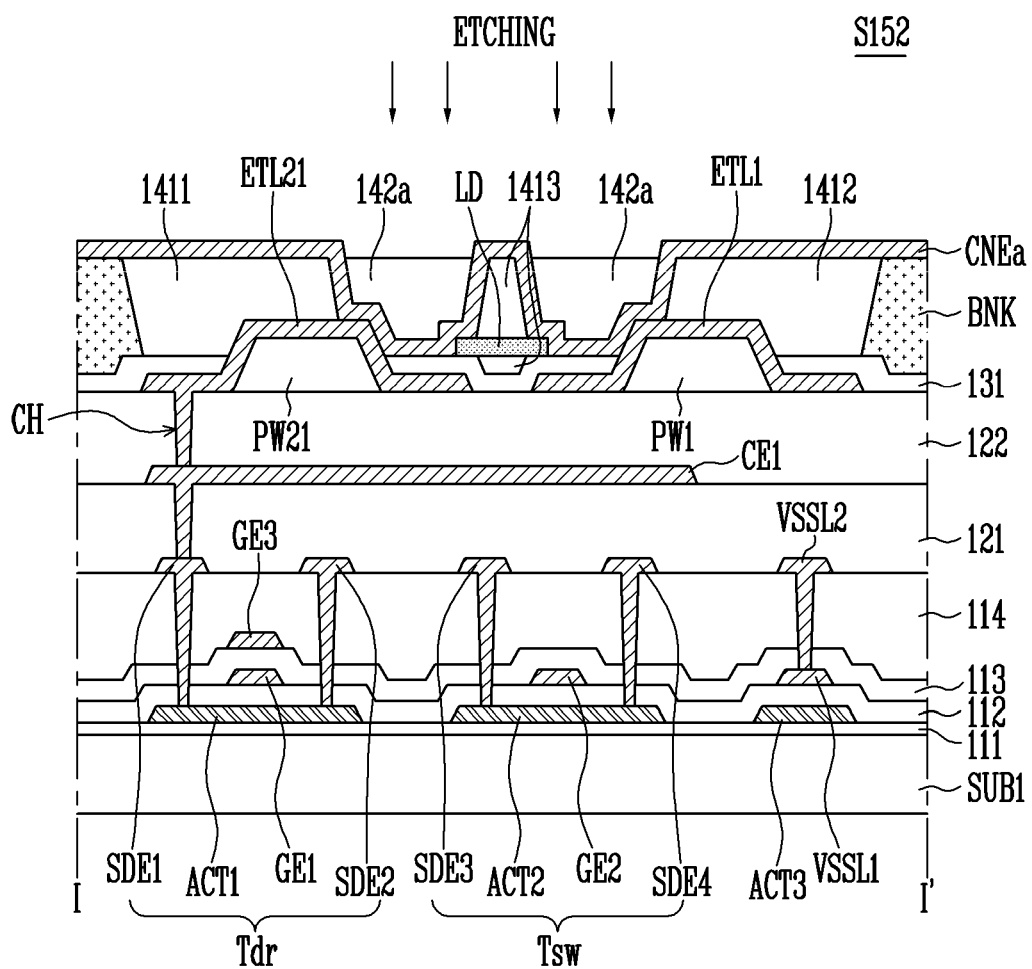

Referring to FIGS. 24 and 25, the contact-electrode forming S150 may be performed. The contact-electrode forming S150 corresponds to forming the contact electrodes ETL1, ETL21, ETL22, and ETL23. The contact-electrode forming S150 may include a plurality of sub-active acts. For example, the contact-electrode forming S150 may include a contact-electrode-material-layer forming S151, and a second organic-material-layer forming S152.

First, as shown in FIG. 24, at the contact-electrode-material-layer forming S151, a contact electrode material layer CNEa may be provided throughout the entire surface of the display panel to cover ends of the first to third organic patterns 1411, 1412, and 1413, the first electrode ETL1, the second electrode ETL21, the insulating layer 131, and the light emitting element LD. Here, the contact electrode material layer CNEa contains the material included in the first and second contact electrodes ETL1 and ETL21.

The contact electrode material layer CNEa may be formed on upper portions of the first to third organic patterns 1411, 1412, and 1413 and edges between the first to third organic patterns 1411, 1412, and 1413. The contact electrode material layer CNEa may define grooves on an upper portion thereof and between the first to third organic patterns 1411, 1412, and 1413. Furthermore, the contact electrode material layer CNEa may be formed to contact ends of the first electrode ETL1, the second electrode ETL21, and the light emitting elements LD.

Figure 26:
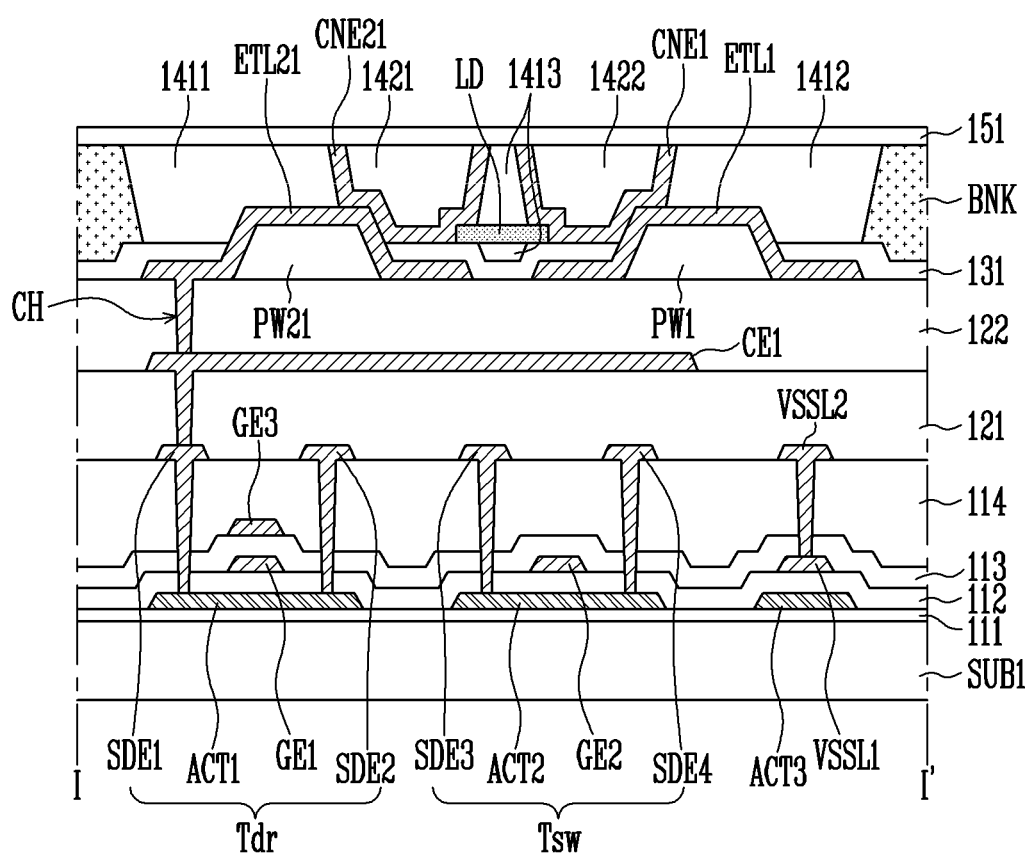

Subsequently, as shown in FIG. 25, at the second organic-material-layer forming and etching S152, a second organic material layer 142a may be formed between the first to third organic patterns 1411, 1412, and 1413. The second organic material layer 142a may be formed by coating the above-described groove. Subsequently, the etching process may be performed. For example, the etching process may be a wet-etching process. By the etching process, the contact electrode material layer CNEa may be removed from an area overlapping the upper portions of the first to third organic patterns 1411, 1412, and 1413, and the contact electrode material layer CNEa may remain in the area overlapping the second organic material layer 142a. As illustrated in FIG. 26, the remaining contact electrode material layer CNEa may become the first contact electrode CNE1 and the second contact electrode CNE21. Furthermore, the second organic material layer 142a may become the fourth organic pattern 1421 in the area overlapping the second contact electrode CNE21, and may become the fifth organic pattern 1422 in the area overlapping the first contact electrode CNE1.

When the contact electrode material layer CNEa is formed as the first contact electrode CNE1 and the second contact electrode CNE21 through the contact-electrode forming S150 and the second organic-material-layer forming and etching S152, the first contact electrode CNE1 and the second contact electrode CNE21 may be formed without a separate mask.

Subsequently, as shown in FIG. 26, the display device may be manufactured through the thin-film encapsulation layer forming S160 of forming the thin-film encapsulation layer 151 on the first to third organic patterns 1411, 1412, and 1413, the first contact electrode CNE1, and the second contact electrode CNE21.

Next, a display device in accordance with an embodiment will be described. Hereinafter, duplicative description of the components shown in FIGS. 1 to 26 will not be repeated here, and the same or similar reference numerals are used.

Figure 27:
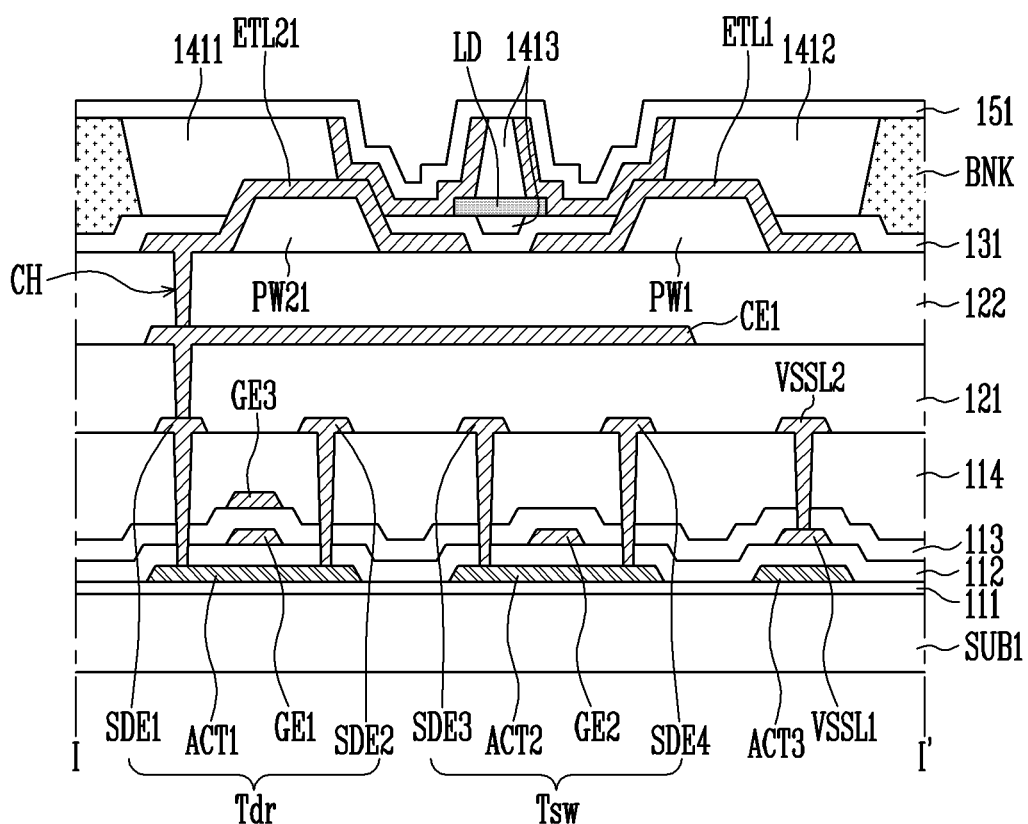
FIG. 27 is a cross-sectional view illustrating a display panel in accordance with an embodiment of the present disclosure.
Figure 28:
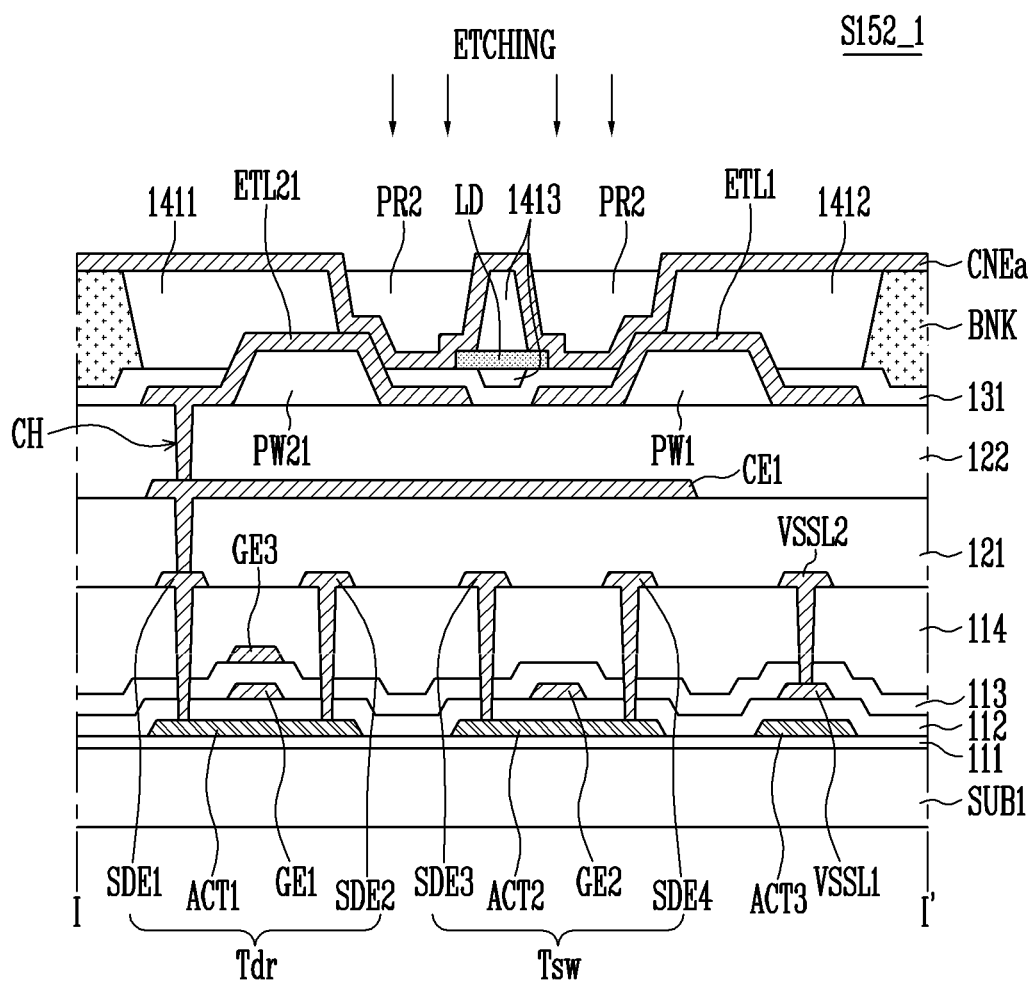
FIGS. 28 and 29 are cross-sectional views illustrating some processes of the manufacturing method of the display device of FIG. 27.
Figure 29:
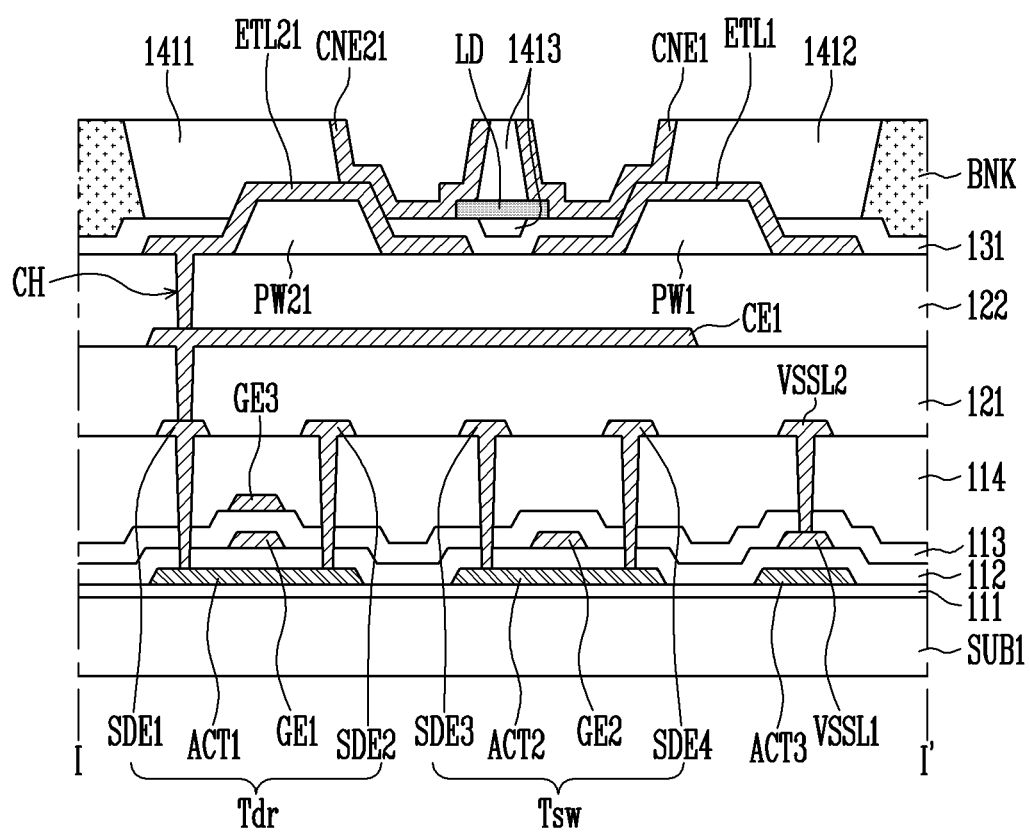

FIG. 27 is a cross-sectional view illustrating a display panel in accordance with an embodiment of the present disclosure. FIGS. 28 and 29 are cross-sectional views illustrating some processes of the manufacturing method of the display device of FIG. 27. FIG. 27 illustrates a modification of a portion corresponding to a portion taken along line I-I' of FIG. 13.

The embodiment of FIG. 27 is different from that of FIG. 14 in that the fourth organic pattern 1421 and the fifth organic pattern 1422 are omitted.

Referring to FIGS. 28 and 29, the contact-electrode forming S150 may include the contact-electrode-material-layer forming S151, and a second photo-resist-material forming and etching S152_1. For example, at the contact-electrode forming S150, the second photo resist material PR2 may be applied between the first to third organic patterns 1411, 1412 and 1413 on the contact electrode material layer CNEa, and then be etched.

After the second photo-resist-material forming and etching S152_1, the contact electrode material layer CNEa may be removed from the area overlapping the upper portions of the first to third organic patterns 1411, 1412 and 1413, and the second photo resist material PR2 may also be removed. In this case, the contact electrode material layer CNEa may remain in the area overlapping the second photo resist material PR2. The remaining contact electrode material layer CNEa may be divided into the first contact electrode CNE1 and the second contact electrode CNE2.

Figure 30:
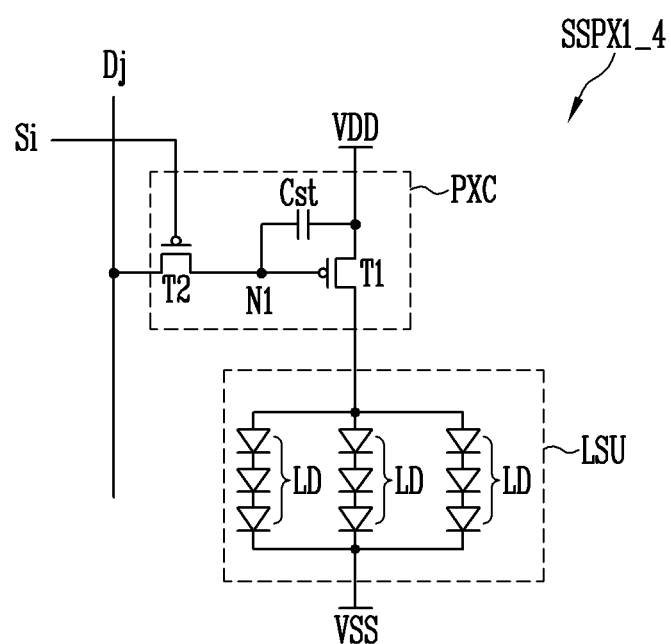
FIGS. 30 to 33 are circuit diagrams illustrating another example applicable to a unit pixel included in a sub-pixel of a display panel in accordance with an embodiment of the present disclosure.
Figure 31:
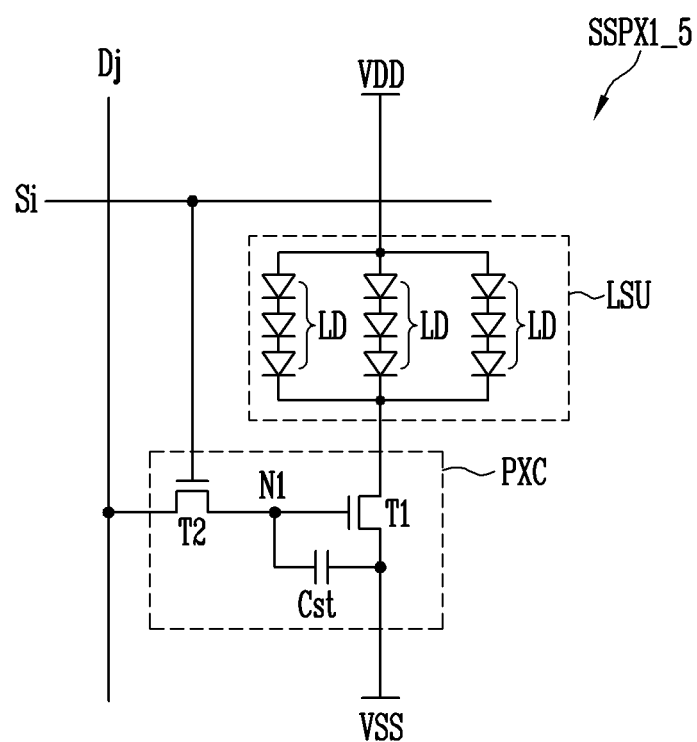
Figure 32:
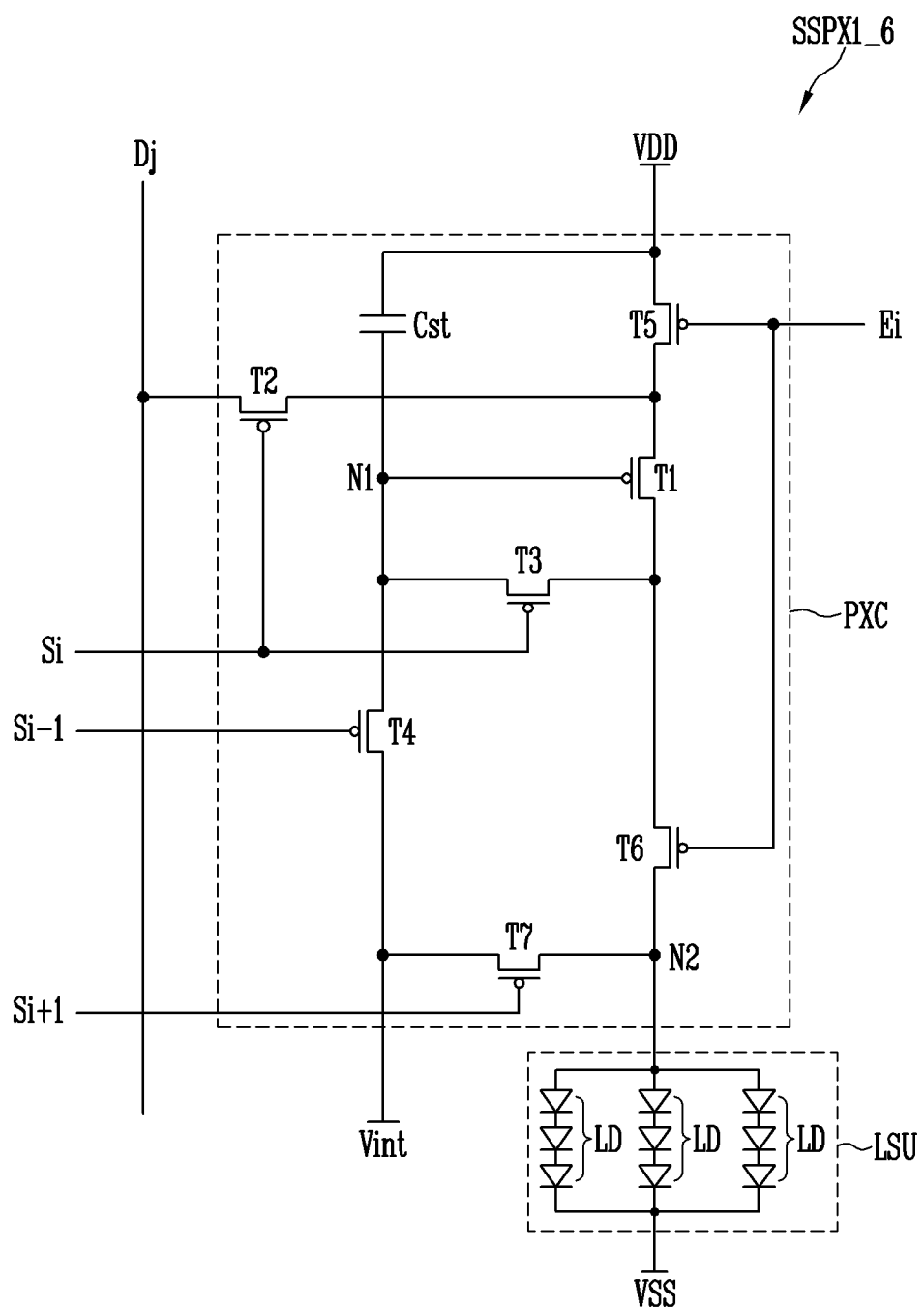
Figure 33:
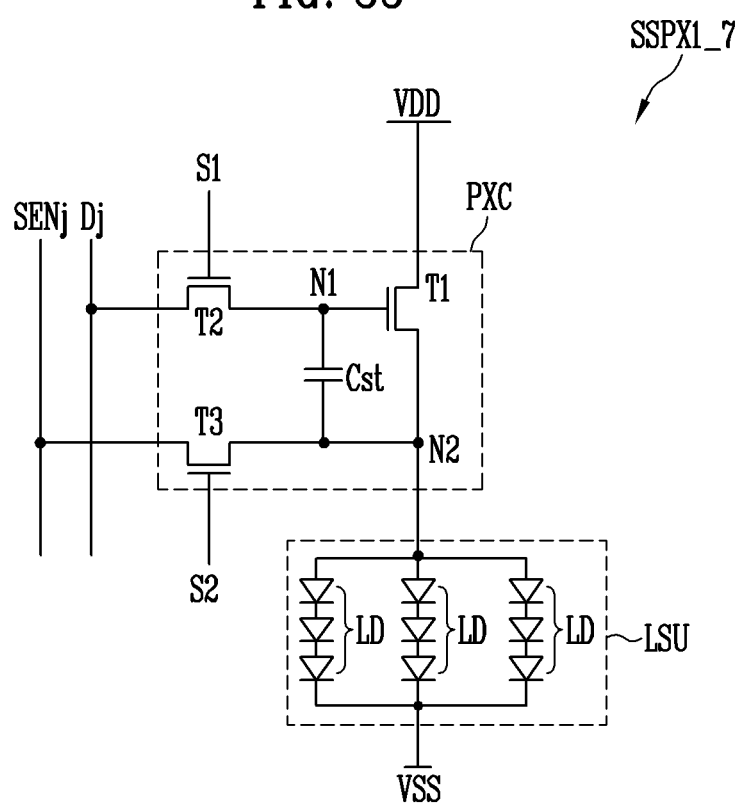

FIGS. 30 to 33 are circuit diagrams illustrating another example applicable to a unit pixel included in a sub pixel of a display panel in accordance with an embodiment of the present disclosure. FIG. 30 shows a unit pixel SSPX1_4, FIG. 31 shows a unit pixel SSPX1_5, FIG. 32 shows a unit pixel SSPX1_6, and FIG. 33 shows a unit pixel SSPX1_7. FIGS. 30 to 33 correspond to modifications of FIGS. 9 to 12, respectively.

Referring to FIGS. 30 to 33, in some embodiments, the plurality of light emitting elements LD may be coupled in series or in parallel.

Figure 34:
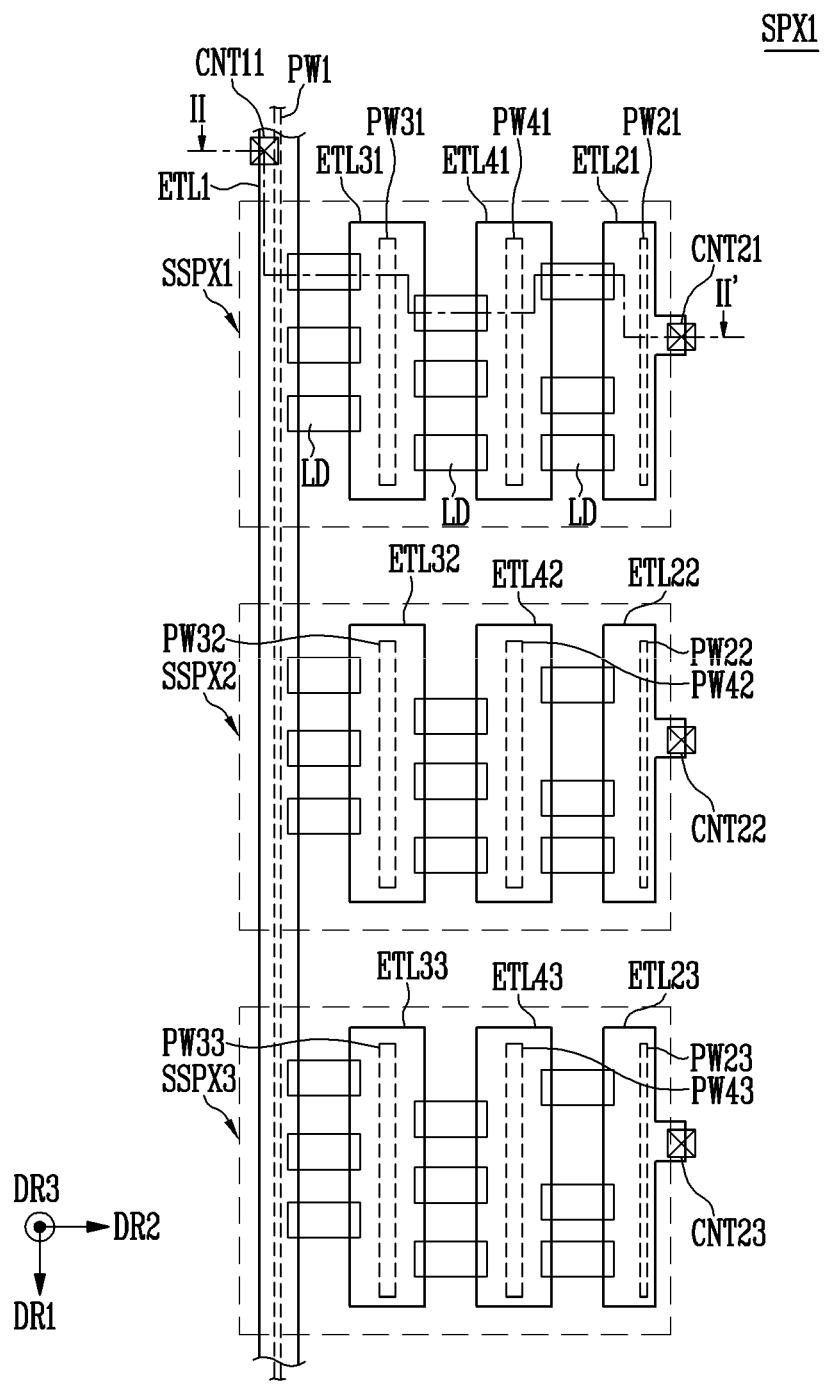
FIG. 34 is a planar layout diagram illustrating the arrangement of some components in one sub-pixel included in the display panel in accordance with the further embodiment of the present disclosure.
Figure 35:
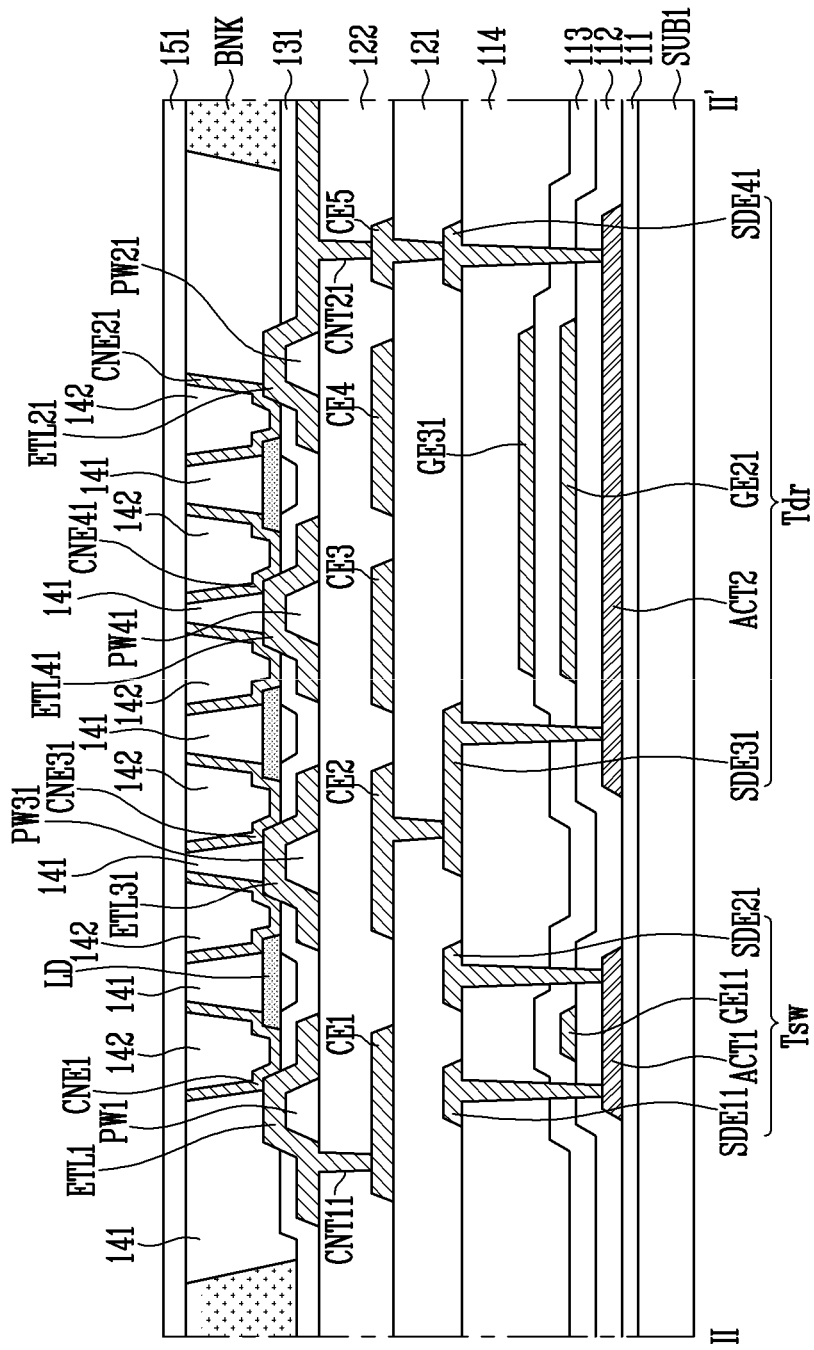
FIG. 35 is a cross-sectional view of the display panel taken along line II-II' of FIG. 27.

FIG. 34 is a planar layout diagram illustrating the arrangement of some components in one sub pixel included in the display panel in accordance with the further embodiment of the present disclosure. FIG. 35 is a cross-sectional view of the display panel taken along line II-II' of FIG. 34. The display panel illustrated in FIGS. 34 and 35 correspond to an embodiment to which the light emitting elements LD of FIGS. 30 to 33 are applied. Because the first to third unit pixels SSPX1 to SSPX3 are substantially equal to each other, the first unit pixel SSPX1 will be mainly described.

Referring to FIGS. 34 and 35, the display panel in accordance with this embodiment is different form the display panel of FIGS. 13 and 14 in that island electrodes ETL31, ETL32, ETL33, ETL41, ETL42, and ETL43 are included between the first electrode ETL1 and the second electrodes ETL21, ETL22, and ETL23.

Each of the first to fourth electrodes ETL1, ETL21, ETL31, and ETL41 in the first unit pixel SSPX1 may extend in the first direction DR1, and may be spaced apart from each other by a set or predetermined interval in the second direction DR2 to be arranged side by side (in parallel, for example, substantially parallel to each other). In an embodiment, the length of the first electrode ETL1 extending in the first direction DR1 may be longer than the lengths of the second to fourth electrodes ETL21, ETL31, and ETL41 extending in the first direction DR1. The third electrode ETL31 and the fourth electrode ETL41 may be between the first electrode ETL1 and the second electrode ETL21. The third electrode ETL31 and the fourth electrode ETL41 may be island electrodes floating from the first electrode ETL1 and the second electrode ETL21. Thus, each of the third electrode ETL31 and the fourth electrode ETL41 may be referred to as an island electrode.

According to an embodiment, the first electrode ETL1 may be an electrode shared by the first to third unit pixels SSPX1 to SSPX3. In this case, the first to third unit pixels may be arranged in the first direction DR1. Each of the first to fourth electrodes ETL1, ETL22, ETL32, and ETL42 in the second unit pixel SSPX2 may extend in the first direction DR1, and may be spaced apart from each other by a set or predetermined interval in the second direction DR2 to be arranged side by side (in parallel, for example, substantially parallel to each other). Likewise, each of the first to fourth electrodes ETL1, ETL23, ETL33, and ETL43 in the third unit pixel SSPX3 may extend in the first direction DR1, and may be spaced apart from each other by a set or predetermined interval in the second direction DR2 to be arranged side by side (in parallel, for example, substantially parallel to each other).

The light emitting elements LD may be between the first electrode ETL1 and the second ETL21, between the second electrode ETL21 and the third electrode ETL31, and between the third electrode ETL31 and the fourth electrode ETL41.

In FIG. 35, the fourth conductive layer on the first protective layer 121 includes the first to fifth conductive patterns CE1 to CE5.

The second conductive pattern CE2 may be coupled to any one of the source electrode SDE31 and the drain electrode SDE41 of the first transistor Tdr through one contact hole formed through the first protective layer 121, and the fifth conductive pattern CE5 may be coupled to a remaining one of the source electrode SDE31 and the drain electrode SDE41 of the first transistor Tdr through another contact hole formed through the first protective layer 121.

The first to fourth partition walls PW1, PW21, PW31, and PW41, the first to fourth electrodes ETL1, ETL21, ETL31, and ETL41, the insulating layer 131, the light emitting elements LD, the first organic layer 141, the first to fourth contact electrodes CNE1, CNE21, CNE31, and CNE41, the second organic layer 142, and the thin-film encapsulation layer 151 may be sequentially on the second protective layer 122.

The first to fourth partition walls PW1, PW21, PW31, and PW41 may be on the pixel circuit layer (e.g., second protective layer 122). The first to fourth partition walls PW1, PW21, PW31, and PW41 may protrude from the pixel circuit layer in the thickness direction (e.g. third direction DR3).

The first to fourth electrodes ETL1, ETL21, ETL31, and ETL41 may be on the first to fourth partition walls PW1, PW21, PW31, and PW41, respectively. The first to fourth electrodes ETL1, ETL21, ETL31, and ETL41 may be spaced apart from each other.

In an embodiment, at least a portion of the first electrode ETL1 may overlap the first conductive pattern CE1, at least a portion of the second electrode ETL21 may overlap the fourth conductive pattern CE4 and the fifth conductive pattern CE5, at least a portion of the third electrode ETL31 may overlap the second conductive pattern CE2, and at least a portion of the fourth electrode ETL41 may overlap the third conductive pattern CE3.

The first electrode ETL1 may be electrically coupled to the first conductive pattern CE1 through a first contact hole CNT11, and the second electrode ETL21 may be electrically coupled to the fifth conductive pattern CE5 through a second contact hole CNT21. The second protective layer 122 may also include a third contact hole CNT22 and a fourth contact hole CNT23. The fifth conductive pattern CE5 may correspond to the first connection pattern CE1 of FIG. 14. The third electrode ETL31 may be insulated from the second conductive pattern CE2, the fourth electrode ETL41 may be insulated from the third conductive pattern CE3, and the second electrode ETL21 may be insulated from the fourth conductive pattern CE4.

The first to fourth contact electrodes CNE1, CNE21, CNE31, and CNE41 may be on the first and second ends of the first to fourth electrodes ETL1, ETL21, ETL31, ETL41 and the light emitting elements LD. In an embodiment, the first to fourth contact electrodes CNE1, CNE21, CNE31, and CNE41 may be on the same layer (e.g., on the same level) as illustrated in FIG. 35. In this case, the first to fourth contact electrodes CNE1, CNE21, CNE31, and CNE41 may be formed using the same (e.g., substantially the same) electrode material in the same (e.g., substantially the same) process.

The first contact electrode CNE1 may be on the first electrode ETL1 to contact the first electrode ETL1. For example, the first contact electrode CNE1 may be located to come into contact (e.g., physical contact) with the first electrode ETL1 on one area of the first electrode ETL1 that is not covered by the insulating layer 131. Furthermore, the first contact electrode CNE1 may be on first ends to contact at least one light emitting element adjacent to the first electrode ETL1, for instance, the first ends of the plurality of light emitting elements LD. In other words, the first contact electrode CNE1 may be located to cover the first end of each of the light emitting elements LD and at least one area of the first electrode ETL1 corresponding thereto. Thereby, the first end of each of the light emitting elements LD may be electrically coupled to the first electrode ETL1.

Similarly, the third contact electrode CNE31 may be on the third electrode ETL31 to contact the third electrode ETL31. For example, the third contact electrode CNE31 may be located to contact the third electrode ETL31 on one area of the third electrode ETL31 that is not covered by the insulating layer 131. Furthermore, the third contact electrode CNE31 may be on ends of at least two light emitting elements adjacent to the third electrode ETL31 to contact the ends of the at least two light emitting elements. In other words, the third contact electrode CNE31 may be located to cover the first end or the second end of each of the light emitting elements LD and at least one area of the third electrode ETL31 corresponding thereto. Thereby, the first end or the second end of each of the light emitting elements LD may be electrically coupled to the third electrode ETL31.

Similarly, the fourth contact electrode CNE41 may be on the fourth electrode ETL41 to contact the fourth electrode ETL41. For example, the fourth contact electrode CNE41 may be located to contact the fourth electrode ETL41 on one area of the fourth electrode ETL41 that is not covered by the insulating layer 131. Furthermore, the fourth contact electrode CNE41 may be on ends of at least two light emitting elements adjacent to the fourth electrode ETL41 to contact the ends of the at least two light emitting elements. In other words, the fourth contact electrode CNE41 may be located to cover the first end or the second end of each of the light emitting elements LD and at least one area of the fourth electrode ETL41 corresponding thereto. Thereby, the first end or the second end of each of the light emitting elements LD may be electrically coupled to the fourth electrode ETL41.

Similarly, the second contact electrode CNE21 may be on the second electrode ETL21 to contact the second electrode ETL21. For example, the second contact electrode CNE21 may be located to contact the second electrode ETL21 on one area of the second electrode ETL21 that is not covered by the insulating layer 131. Furthermore, the second contact electrode CNE21 may be on the second end to contact the second end of at least one light emitting element adjacent to the second electrode ETL21. In other words, the second contact electrode CNE21 may be located to cover the second end of each of the light emitting elements LD and at least one area of the second electrode ETL21 corresponding thereto. Thereby, the second end of each of the light emitting elements LD may be electrically coupled to the second electrode ETL21.

In some embodiments, one end of one light emitting element may contact the first contact electrode CNE1, while the other end may contact the third contact electrode CNE31. One end of another light emitting element may contact the third contact electrode CNE31, while the other end may contact the fourth contact electrode CNE41. One end of a further light emitting element may contact the fourth contact electrode CNE41, while the other end may contact the first contact electrode CNE1.

In embodiments of the present disclosure, the manufacturing method of the display device can minimize or reduce the number of masks that are utilized.

Furthermore, because the upper surface of the display device is generally flat, additional elements can be easily stacked.

The effects of the present disclosure are not limited by the foregoing, and other various effects are included within the scope of the present disclosure.

Although the embodiments of the present disclose have been disclosed, those skilled in the art will appreciate that the present disclose can be implemented as other concrete forms, without departing from the scope and spirit of the disclose as disclosed in the accompanying claims, and equivalents thereof. Therefore, it should be understood that the exemplary embodiment is only for illustrative purpose and do not limit the bounds of the present disclosure.

What is claimed is:
1. A display device, comprising:
   a pixel circuit layer comprising a plurality of transistors;
   a first partition wall and a second partition wall on the pixel circuit layer, and each protruding in a thickness direction;
   a first electrode and a second electrode at a same level in the thickness direction, and on the first partition wall and the second partition wall, respectively;
   a light emitting element between the first electrode and the second electrode;
   a first organic pattern directly on the light emitting element; and
   an insulating layer on a portion of each of the first and second electrodes,
   wherein the insulating layer exposes another portion of each of the first and second electrodes.
2. The display device according to claim 1, further comprising:
   a second organic pattern directly on the first electrode; and
   a third organic pattern directly on the second electrode.

3. The display device according to claim 2, wherein the first organic pattern, the second organic pattern, and the third organic pattern are at a same level in the thickness direction.

4. The display device according to claim 1, further comprising:
- a first contact electrode in contact with the first electrode and a first end of the light emitting element; and
- a second contact electrode in contact with the second electrode and a second end of the light emitting element.

5. The display device according to claim 4, further comprising:
- a second organic pattern directly on the first electrode; and
- a third organic pattern directly on the second electrode,
- wherein the first contact electrode is between the first organic pattern and the second organic pattern, and
- wherein the second contact electrode is between the first organic pattern and the third organic pattern.

6. The display device according to claim 5,
- wherein the first contact electrode is located along an edge of a groove defined by the first organic pattern and the second organic pattern, and
- wherein the second contact electrode is located along an edge of a groove defined by the first organic pattern and the third organic pattern.

7. The display device according to claim 5, further comprising:
- a fourth organic pattern directly on the first contact electrode; and
- a fifth organic pattern directly on the second contact electrode.

8. The display device according to claim 7, wherein the fourth organic pattern and the fifth organic pattern are at a same level in the thickness direction.

9. The display device according to claim 7, wherein respective upper portions of the first organic pattern, the second organic pattern, the third organic pattern, the fourth organic pattern, and the fifth organic pattern have the same height.

10. The display device according to claim 1,
- wherein the insulating layer is between the first electrode and the second electrode, and
- wherein the light emitting element is on an area between the first electrode and the second electrode of the insulating layer.

11. The display device according to claim 10, further comprising:
- a bank on the insulating layer, and having a height higher than that of the first and second partition walls.

12. The display device according to claim 11, further comprising:
- a second organic pattern and a third organic pattern between the bank and the first organic pattern,
- wherein the first organic pattern, the second organic pattern, and the third organic pattern are at a same level in the thickness direction.

* * * * *